(12) United States Patent
Hyun et al.

(10) Patent No.: US 9,224,751 B2
(45) Date of Patent: Dec. 29, 2015

(54) THREE-DIMENSIONAL (3D) SEMICONDUCTOR DEVICE

(71) Applicant: SK hynix Inc., Gyeonggi-do (KR)

(72) Inventors: Chan Sun Hyun, Gyeonggi-do (KR); Myung Kyu Ahn, Gyeonggi-do (KR); Woo June Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/453,403

(22) Filed: Aug. 6, 2014

(65) Prior Publication Data
US 2015/0279856 A1    Oct. 1, 2015

(30) Foreign Application Priority Data
Mar. 27, 2014    (KR) .......................... 10-2014-0035956

(51) Int. Cl.
*H01L 27/115* (2006.01)
*H01L 21/768* (2006.01)
*H01L 23/528* (2006.01)
*H01L 23/532* (2006.01)

(52) U.S. Cl.
CPC .... *H01L 27/11582* (2013.01); *H01L 21/76841* (2013.01); *H01L 21/76871* (2013.01); *H01L 21/76879* (2013.01); *H01L 21/76895* (2013.01); *H01L 23/528* (2013.01); *H01L 23/53257* (2013.01); *H01L 27/11551* (2013.01); *H01L 27/11556* (2013.01); *H01L 27/11558* (2013.01); *G11C 2213/71* (2013.01)

(58) Field of Classification Search
CPC ............ H01L 27/0688; H01L 27/1151; H01L 27/1156; H01L 27/11558; H01L 27/11578; H01L 27/11582; H01L 27/2481; H01L 21/76879; H01L 21/76895; H01L 23/528; G11C 2213/71
See application file for complete search history.

(56) References Cited

U.S. PATENT DOCUMENTS

2014/0191389 A1*   7/2014   Lee ..................... H01L 21/7685
                                                         257/734

FOREIGN PATENT DOCUMENTS

| KR | 1020120041009 | 4/2012 |
|---|---|---|
| KR | 1020140117212 | 10/2014 |

* cited by examiner

Primary Examiner — Thanhha Pham
(74) Attorney, Agent, or Firm — IP & T Group LLP

(57) ABSTRACT

A semiconductor device includes interlayer dielectrics stacked and spaced apart from each other, a channel layer passing through the interlayer dielectrics, line pattern regions each surrounding a sidewall of the channel layer to be disposed between the interlayer dielectrics, a barrier pattern formed along a surface of each of the line pattern regions and the sidewall of the channel layer, a reaction preventing pattern formed on the barrier pattern along a surface of a first region of each of the line pattern regions, the first region being adjacent to the channel layer, a protection pattern filled in the first region on the reaction preventing pattern, and a first metal layer filled in a second region of each of the line pattern regions.

12 Claims, 19 Drawing Sheets

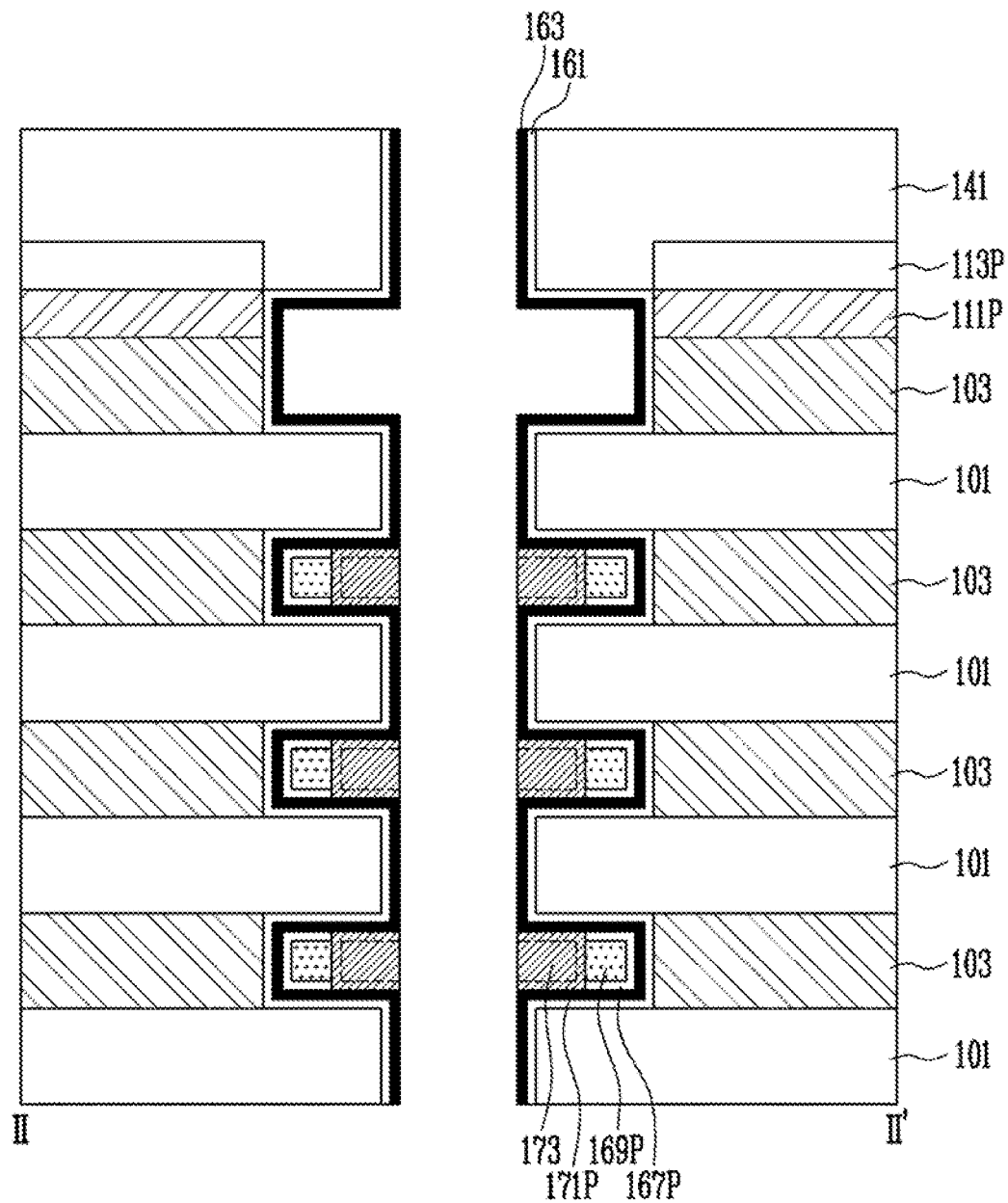

THREE-DIMENSIONAL (3D) SEMICONDUCTOR DEVICE

CROSS-REFERENCE TO RELATED APPLICATION

The present application claims priority to Korean patent application number 10-2014-0035956, filed on Mar. 27, 2014, the entire disclosure of which is incorporated herein in its entirety by reference.

BACKGROUND

1. Field of Invention

Various exemplary embodiments of the present invention relate to a semiconductor device, and more specifically, to a three-dimensional (3D) semiconductor device and a method of manufacturing the same.

2. Discussion of Related Art

Semiconductor devices of various structures have been developed for increasing the degree of integration. For example, a 3D semiconductor device including memory cells having a 3D arrangement has been suggested.

The 3D semiconductor device includes interlayer dielectrics and conductive patterns that are alternately stacked on top of one another, and a channel layer passing through the interlayer dielectrics and the conductive patterns. Memory cells are then arranged in a 3D structure along the channel layer.

The 3D semiconductor device may be formed by alternately stacking interlayer dielectrics and sacrificial layers, and then replacing the sacrificial layers with conductive patterns. However, during the process of replacing the sacrificial layers with the conductive patterns, some of the conductive patterns may be damaged.

SUMMARY

Various exemplary embodiments of the present invention are directed to a semiconductor device having reduced process errors and a method of manufacturing the same.

According to an embodiment of the present invention, a semiconductor device may include interlayer dielectrics stacked and spaced apart from each other, a channel layer passing through the interlayer dielectrics, line pattern regions each surrounding a sidewall of the channel layer to be disposed between the interlayer dielectrics, a barrier pattern formed along a surface of each of the line pattern regions and the sidewall of the channel layer, a reaction preventing pattern formed on the barrier pattern along a surface of a first region of each of the line pattern regions, the first region being adjacent to the channel layer, a protection pattern filled in the first region on the reaction preventing pattern, and a first metal layer filled in a second region of each of the line pattern regions.

According to another embodiment of the present invention, a method of manufacturing a semiconductor device may include forming stacked interlayer dielectrics having a channel layer passing therethrough and an opening interposed therebetween, wherein the opening includes line pattern regions suitable for opening a sidewall of the channel layer and pad pattern regions connected to end portions of the line pattern regions, forming a barrier layer along a surface of the opening, forming a reaction preventing pattern and a protection pattern in a first region of each of the line pattern regions, the first region being adjacent to the channel layer, and forming a first metal layer to be filled in a second region of each of the line pattern regions.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 5A to 5L are drawings illustrating a method of manufacturing a semiconductor device according to an embodiment of the present invention;

DETAILED DESCRIPTION

Figure 1:
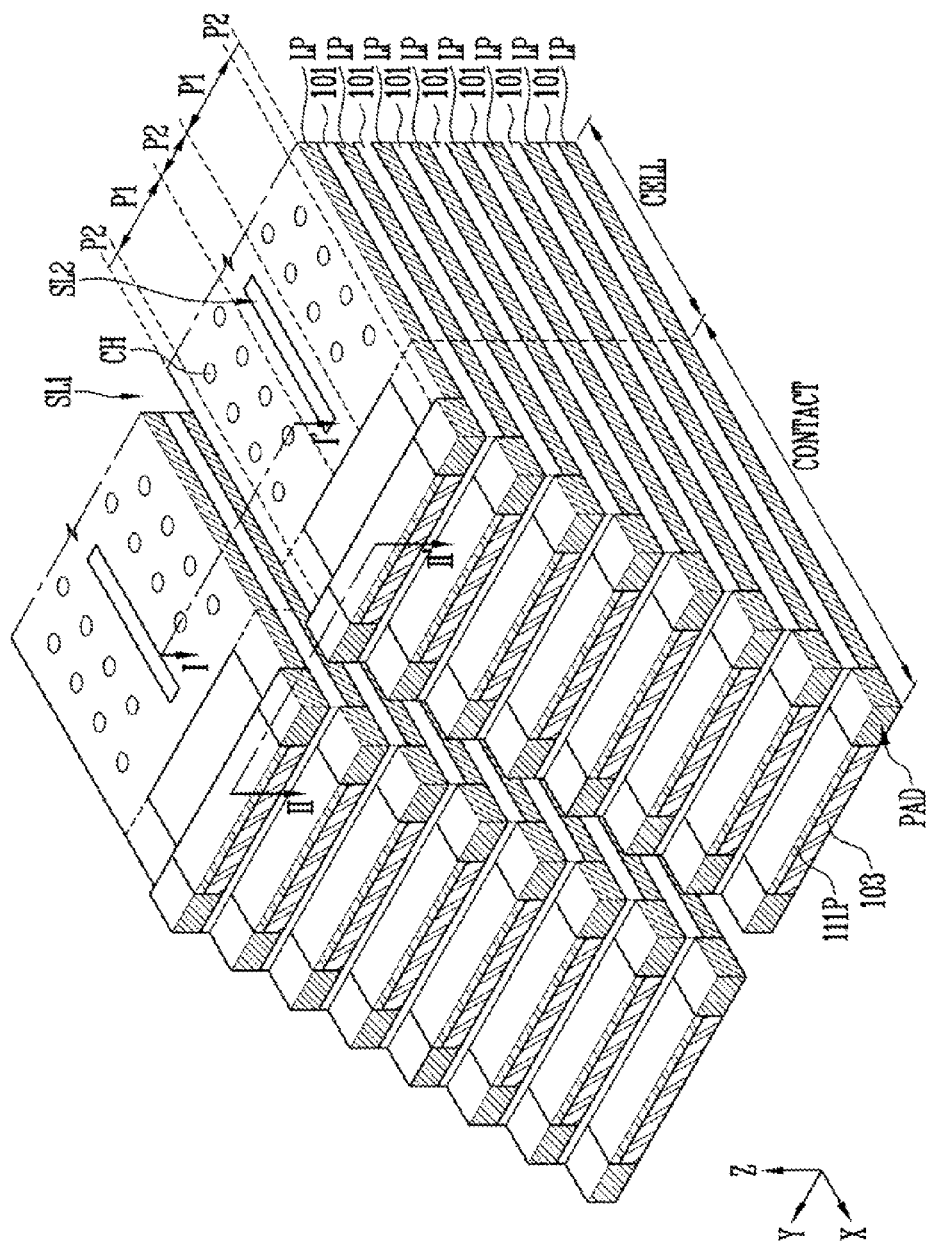
FIG. 1 is a perspective view illustrating a semiconductor device according to an embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein.

The drawings may not be necessarily to scale and, in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the drawings, the thicknesses and length of components are exaggerated compared to the actual physical thickness and length for convenience of illustration. In the following description, detailed explanations of known related functions and constitutions may be omitted to avoid unnecessarily obscuring the subject manner of the present invention. Like reference numerals refer to like elements throughout the specification and drawings.

Furthermore, 'connected/coupled' represents that one component is directly coupled to another component or indirectly coupled through another component. In this specification, a singular form may include a plural form, and vice versa, as long as it is not specifically mentioned. Furthermore, 'include/comprise' or 'including/comprising' used in the specification represents that one or more components, steps, operations, and elements exist or may be added.

FIG. 1 is a perspective view illustrating a semiconductor device according to an exemplary embodiment of the present invention.

Referring to FIG. 1, a semiconductor device includes a contact area CONTACT and a cell area CELL. The cell area CELL is an area in which a memory string including memory cells having a 3D arrangement is disposed. The contact area CONTACT is an area in which contact plugs (not shown) connected to the memory string are disposed.

The memory string includes memory cells connected in series along a channel layer CH passing through first interlayer dielectrics 101 and line patterns LP that are alternately stacked, so that a first interlayer dielectric 101 is stacked on top of a line pattern LP. The line patterns LP may represent word lines connected to the memory cells. The memory cells are defined at intersections between the line patterns LP and the channel layer CH, and are stacked along the channel layer CH. The structure of the channel layer CH may be changed to various other shapes, such as a straight structure, a U-type structure, and a W-type structure, depending on the structure of a memory string to be formed. A structure stacked at an upper side or a lower side of the line patterns LP, used as word lines, may also be formed depending on the structure of the memory string to be formed.

The first interlayer dielectrics 101 and the line patterns LP extend from the cell area CELL to form a stepped structure at the contact area CONTACT. That is, a line pattern LP disposed at a lower side among the line patterns LP extends longer toward the contact area CONTACT, thereby forming a stepped structure, and a first interlayer dielectric 101 disposed at a lower side among the first interlayer dielectrics 101 extends longer toward the contact area CONTACT, thereby forming a stepped structure. The first interlayer dielectrics 101 and the line patterns LP are separated by a first slit SL1 into stacked bodies each having a stepped structure. In addition, a second slit SL2 formed at the cell area CELL passes through each of the stacked bodies including the first interlayer dielectrics 101 and the line patterns LP. The number of the first interlayer dielectrics 101 and the line patterns LP stacked may vary depending on the number of memory cells desired to be stacked. The first and second slits SL1 and SL2 may be filled with insulating layers.

The line patterns LP include end portions extending to the contact area CONTACT. The end portions of the line patterns LP are divided while interposing first sacrificial layers 103 therebetween. That is, one of the line patterns LP includes end portions divided while interposing a first sacrificial layer 103 formed on the same layer as the one line pattern LP. Each of the end portions of the line patterns LP has a sidewall adjacent to the first slit SL1.

The end portions of the line patterns LP are connected to pad patterns PAD disposed at the contact area CONTACT, respectively. The pad patterns PAD may have thicknesses greater than those of the line patterns LP. The first sacrificial layers 103 may extend up to and in between the pad patterns PAD. Second sacrificial patterns 111P may be formed on the first sacrificial layers 103 provided between each of two pad patterns PAD. The pad patterns PAD may be formed using various methods, and the second sacrificial patterns 111P may be omitted or removed depending on a process of forming the pad patterns PAD.

Each first interlayer dielectric 101 may extend up to an end portion of each of the pad patterns PAD that makes contact with the first interlayer dielectric 101. The first sacrificial layer 103 may be disposed at an upper side of the first interlayer dielectric 101 while making contact with the first interlayer dielectric 101.

Hereinafter, regions on which the line patterns LP are formed are referred to as line pattern regions, and regions on which the pad patterns PAD are formed are referred to as pad pattern regions. Line pattern regions each defined between the first interlayer dielectrics 101 surrounds the channel layer CH. Each of the line pattern regions includes a first region P1 and a second region P2 excluding the first region P1. The first region P1 is a region adjacent to the channel layer CH and the first sacrificial layers 103, and the second region P2 is a region connected to the first region P1 while being adjacent to the first slit SL1 or the second slit SL2. The second region P2 is a region defined between the first region P1 and the first slit SL1 or between the first region P1 and the second slit SL2. The pad pattern regions have sidewalls defined by the first sacrificial layers 103 and the second sacrificial patterns 111P, and open by the first slit SL1.

Figure 2:
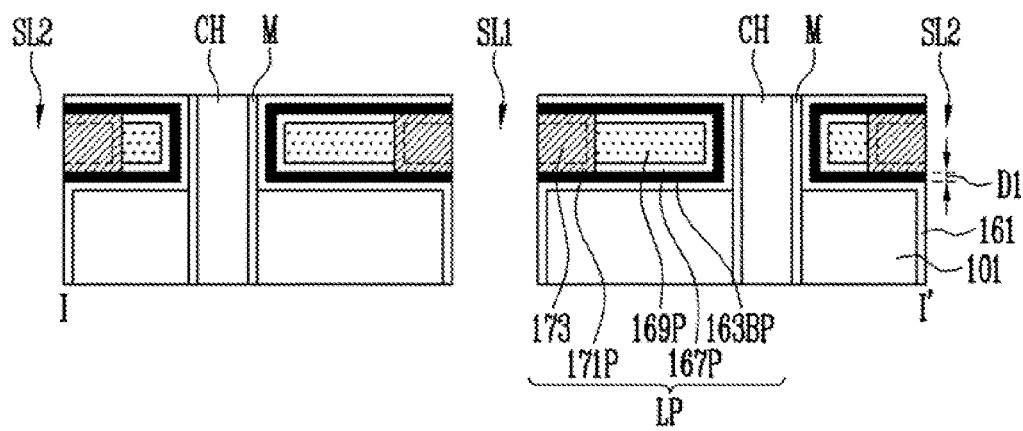
FIG. 2 illustrates a cross sectional view of a line pattern taken along line "I-I'" shown in FIG. 1.

FIG. 2 illustrates a cross sectional view of a line pattern taken along line "I-I'" shown in FIG. 1.

Referring to FIG. 2, the line pattern LP is formed within a line pattern region. The line pattern region has a sidewall defined by the channel layer CH while surrounding the channel layer CH and is open by the first slit SL1 and the second slit SL2. The line pattern LP may be formed on a blocking dielectric layer 161 formed along a surface of the line pattern region. The blocking dielectric layer 161 may extend along surfaces of the first slit SL1 and the second slit SL2 from the line pattern region.

The channel layer CH may be surrounded by multilayer dielectrics M. The multilayer dielectrics M may include at least one of a tunnel dielectric layer, a data storage layer, and a blocking dielectric layer. The tunnel dielectric layer may make contact with the channel layer CH while surrounding the channel layer CH, and the data storage layer may make contact with the tunnel dielectric layer while surrounding the tunnel dielectric layer, and the blocking dielectric layer may make contact with the data storage layer while surrounding the data storage layer. The tunnel dielectric layer may be formed of a silicon oxide layer, and the data storage layer may be formed of a material layer capable of storing electric charges in various forms. For example, the data storage layer may be formed of a polysilicon layer configured to float electric charges or a silicon nitride layer configured to trap electric charges. The blocking dielectric layer may include at least one of a silicon oxide layer and a high k dielectric layer having a permittivity higher than that of a silicon oxide layer.

The line pattern LP may include a first part 163BP of a barrier pattern, a reaction preventing pattern 167P, a second protection pattern 169P, a first metal seed pattern 171P, and a first metal layer 173.

The first part 163BP of the barrier pattern is formed along a surface of the line pattern region, and is divided by the first slit SL1 and the second slit SL2. The first part 163BP of the barrier pattern prevents metal of the first metal seed pattern 171P and the first metal layer 173 from penetrating into the multilayer dielectrics M and the channel layer CH. The first part 163BP of the barrier pattern may be formed of metal or metal nitride, for example, TiN.

The reaction preventing pattern 167P is formed on the first part 163BP of the barrier pattern along a surface of the first region (P1 in FIG. 1) of the line pattern region. The reaction preventing pattern 167P prevents the first part 163BP of the barrier pattern from making direct contact with the second protection pattern 169P so that a reaction between the first part 163BP of the barrier pattern and the second protection pattern 169P is prevented, thereby preventing the thickness of the first part 163BP of the barrier pattern from being reduced and a new material layer from being formed. Since the thickness of the first part 163BP of the barrier pattern is ensured by the reaction preventing pattern 167P, a metal blocking function of the first part 163BP of the barrier pattern is ensured. The reaction preventing pattern 167P may include an oxide layer.

The second protection pattern 169P is filled in the first region (P1 in FIG. 1) of the line pattern region on the reaction preventing pattern 167P. The second protection pattern 169P is formed of a material having an etch selectivity with respect to the reaction preventing pattern 167P and the barrier pattern. For example, the second protection pattern 169P may include polysilicon.

The first metal seed pattern 171P is formed along a surface of the second region (P2 in FIG. 1) of the line pattern region, and the first metal layer 173 is grown from the first metal seed pattern 171P to be filled in the second region (P2 in FIG. 1) of the line pattern region. The first metal seed pattern 171P and the first metal layer 173 may be formed of a metal material having a resistance lower than that of polysilicon to reduce the resistance of the line pattern LP. For example, the first metal seed pattern 171P and the first metal layer 173 may include tungsten.

Figure 3:
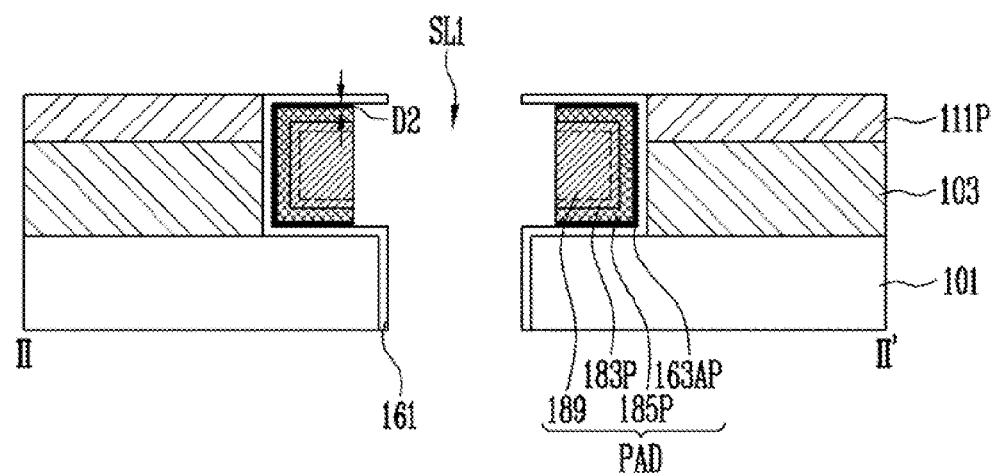
FIG. 3 illustrates a cross sectional view of a pad pattern taken along line "II-II'" shown in FIG. 1.

FIG. 3 illustrates a cross sectional view of a pad pattern taken along line "II-II" shown in FIG. 1.

Referring to FIG. 3, the pad pattern PAD has a sidewall defined by the first sacrificial layer 103 and the second sacrificial pattern 111P, and is formed within the pad pattern region that is opened by the first slit SL1. The pad pattern region is connected to the end portion of the line pattern region. The pad pattern PAD may be formed on the blocking dielectric layer 161 formed along the surface of the pad pattern region. The pad pattern PAD may be formed while being spaced from the first slit SL1 in the pad pattern region. That is, the pad pattern may be formed to be filled in a portion of the pad pattern region.

The pad pattern PAD may include a second part 163AP of the barrier pattern, an etch stop pattern 185P, a second metal seed pattern 183P, and a second metal layer 189. The second part 163AP of the barrier pattern, the etch stop pattern 185P, the second metal seed pattern 183P, and the second metal layer 189 are filled in a portion of the pad pattern region such that the pad pattern region is opened by a predetermined width from an edge of the pad pattern region.

The second part 163AP of the barrier pattern represents a part extending from the first part 163BP of the barrier pattern, shown in FIG. 2, and is formed along the surface of the pad pattern region. The second part 163AP of the barrier pattern is separated by the first slit SL1. The second part 163AP of the barrier pattern is integrally formed with the first part 163BP of the barrier pattern, and is formed of the same material as that of the first part 163BP of the barrier pattern. The second part 163AP of the barrier pattern has a thickness less than that of the first part 163BP of the barrier pattern.

The etch stop pattern 185P is formed along a surface of the second part 163AP of the barrier pattern in the pad pattern region. The etch stop pattern 185P is formed as a material for the barrier pattern reacted with another reacting layer. The etch stop pattern 185P has an etch selectivity with respect to the second metal seed pattern 183P and the second metal layer 189. For example, the etch stop pattern 185P may include $TiNSi_x$, where x is a natural number, formed by reacting TiN for the barrier pattern with silicon for a reacting layer.

The second metal seed pattern 183P is formed along the surface of the pad pattern region on the etch stop pattern 185P. The second metal layer 189 is grown from the second metal seed pattern 183P to be filled in the pad pattern region. The second metal seed pattern 183P and the second metal layer 189 may be formed of a metal material having a resistance lower than that of polysilicon to reduce the resistance of the pad pattern PAD. For example, the second metal seed pattern 183P and the second metal layer 189 may include tungsten.

According to the above-described structure shown in FIG. 2, the first part 163BP of the barrier pattern adjacent to the channel layer CH is protected by the second protection pattern 169P. Accordingly, the first part 163BP of the barrier pattern is prevented from being damaged due to a gas that is generated during the deposition process of forming the first metal seed pattern 171P.

According to the present invention shown in FIG. 2, since the reaction preventing pattern 167P is formed between the first part 163BP of the barrier pattern and the second protection pattern 169P, the first part 163BP of the barrier pattern is prevented from reacting with the second protection pattern 169P and from getting thinner. In this manner, the thickness of the first part 163BP of the barrier pattern is secured.

According to the present invention, the first part 163BP of the barrier pattern is prevented from being damaged so that the characteristics of the memory cell are improved.

According to the present invention, the pad pattern PAD is formed having a thickness greater than that of the line pattern LP, thereby securing a contact margin when a contact plug (not shown) is connected to the pad pattern PAD.

FIGS. 4A to 5L are drawings illustrating processes of manufacturing a semiconductor device according to an exemplary embodiment of the present invention. FIGS. 4A to 4D are perspective views describing a process of opening a pad pattern region and a line pattern region, which in particular illustrate the contact area shown in FIG. 1. FIGS. 5A to 5L are cross sectional views of the contact area taken along line "II-II" of FIG. 1 to describe a process of forming a pad pattern and a line pattern.

Figure 4A:
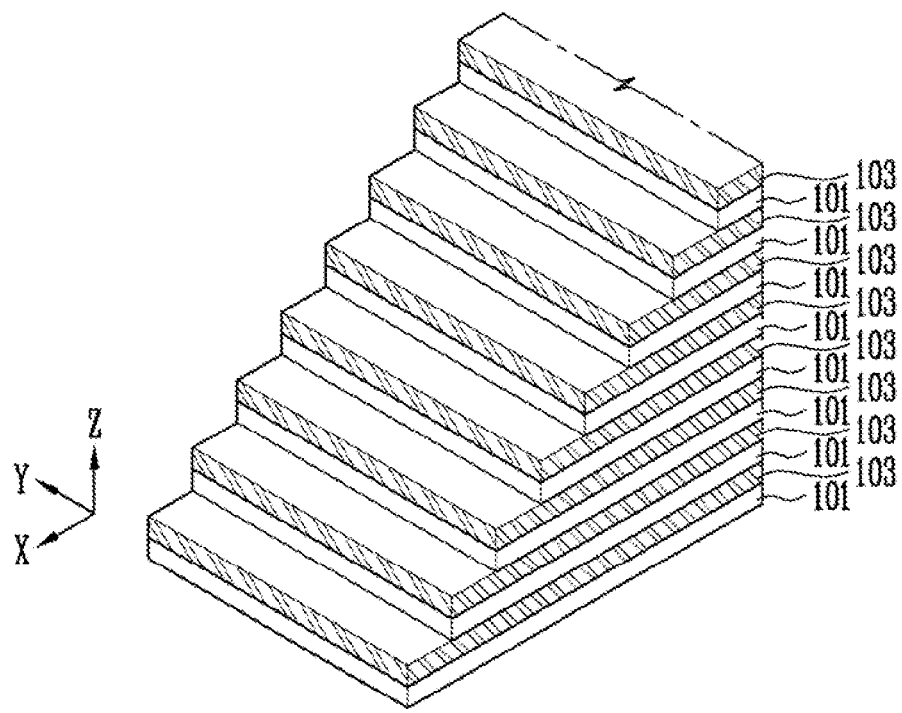
FIGS. 4A to 4D are drawings illustrating a method of manufacturing a semiconductor device according to an exemplary embodiment of the present invention.

Referring to FIG. 4A, the first interlayer dielectrics 101 and the first sacrificial layers 103 are alternately stacked so that one of the first interlayer dielectrics 101 is stacked on top of one of the first sacrificial layers 103. The number of the first interlayer dielectrics 101 and the first sacrificial layers 103 stacked may vary. The first interlayer dielectrics 101 and the first sacrificial layers 103 may be formed on a substrate (not shown) including a lower structure (not shown) coated with an insulating layer (not shown). The lower structure may be a source region obtained by injecting impurities onto the substrate, or a source region obtained by forming a doped polysilicon layer on the substrate and patterning the doped polysilicon layer. Alternatively, the lower structure may be a pipe gate with a pipe trench provided inside thereof.

The first sacrificial layers 103 are formed at layers where line patterns and pad patterns are formed. The first sacrificial layers 103 are formed of a material different from the material forming the first interlayer dielectrics 101. The first sacrificial layers 103 may have an etch selectivity with respect to the first interlayer dielectrics 101. For example, the first interlayer dielectrics 101 may be formed of an oxide layer and the first sacrificial layers 103 may be formed of a nitride layer having an etch selectivity with respect to the oxide layer.

Subsequently, a stepped structure is formed by etching the first interlayer dielectrics 101 and the first sacrificial layers 103. Each step of the stepped structure is composed of a single first interlayer dielectric 101 and a single first sacrificial layer 103 formed on the single first interlayer dielectric 101. A part of each of the first sacrificial layers 103 is exposed through the stepped structure.

Although not shown, the channel layer CH described in FIGS. 1 and 2 may be formed after or before forming the stepped structure. When the channel layer CH is formed, a through hole passing through the first interlayer dielectrics 101 and the first sacrificial layers 103 is formed, and then the channel layer CH is formed in the through hole. The channel layer CH may be provided in the form of a tube by forming a semiconductor layer along a surface of the through hole such that a center region of the through hole is open. Alternatively, the channel layer CH may be provided as a buried type by forming a semiconductor layer in the through hole such that the center region of the through hole is filled. Alternately, the channel layer CH may be formed as a combined structure of a tube type and a buried type. The center region of a channel layer CH as a tube type may be filled with an insulating material. Before the channel layer CH is formed, the multi-layer dielectrics M described in FIG. 2 may be further formed along the surface of the through hole.

Figure 4B:
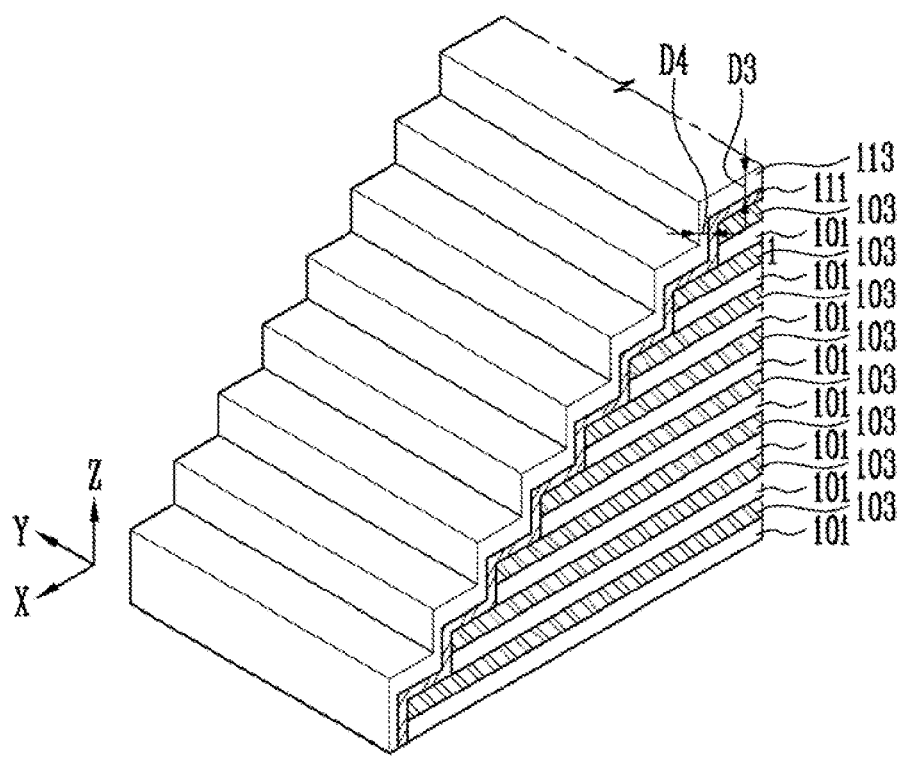

Referring to FIG. 4B, a second sacrificial layer 111 is formed along surfaces of the first sacrificial layers 103 exposed through the stepped structure. The second sacrificial layer 111 is formed along sidewalls and upper surfaces of the stepped structure. The second sacrificial layer 111 may have an etch selectivity with respect to the first interlayer dielectrics 101. The second sacrificial layer 111 may be formed of the same material forming the first sacrificial layers 103. For example, the second sacrificial layer 111 may be formed of a nitride layer.

Subsequently, a first protection layer 113 is formed along a surface of the second sacrificial layer 111. The first protection layer 113 is formed of an insulating material having a poor step coverage characteristic. The first protection layer 113 is formed of an insulating material that allows a deposition thickness D3 on an upper surface of the stepped structure to be greater than the deposition thickness D4 on a sidewall of the stepped structure. For example, the first protection layer 113 may include at least one of a high density plasma oxide ("HDP") layer, a plasma enhanced-tetra ethyl ortho silicate oxide ("PE-TEOS") layer, and an undoped silicate glass oxide ("USG") layer.

Figure 4C:
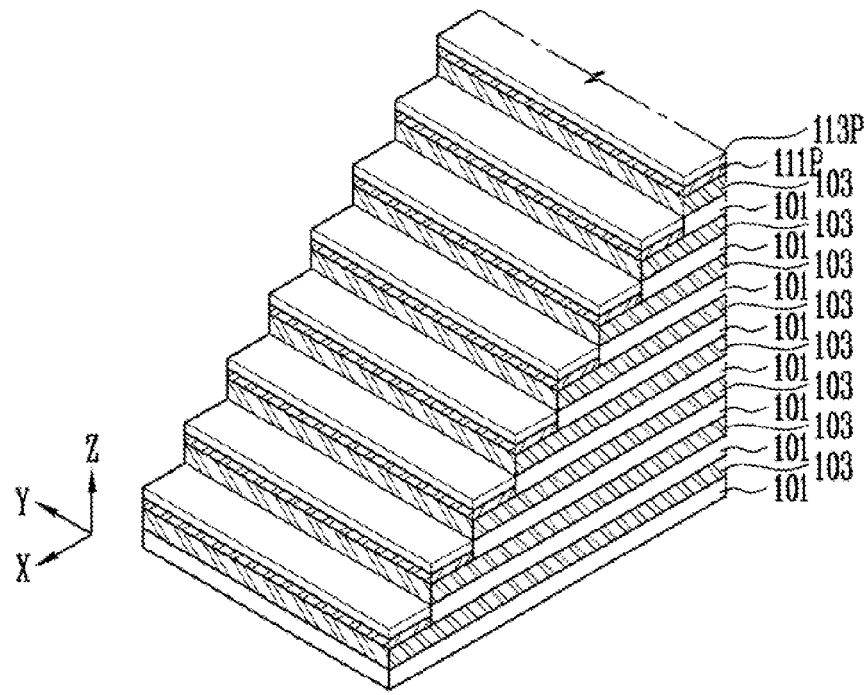

Referring to FIG. 4C, the first protection layer 113, shown in FIG. 4B, is etched to expose the second sacrificial layer 111 formed along the sidewall of the stepped structure, thereby forming first protection patterns 113P. The first protection layer 113 may be etched through a wet etch process. Since the thickness of the first protection layer 113 on the upper surface of the stepped structure is greater than the thickness of the first protection layer 113 on the sidewall of the stepped structure, even if part of the first protection layer 113 formed on the sidewall of the stepped structure is removed through the etch process, the first protection layer 113 formed on the upper surface of the stepped structure may remain and form the first protection patterns 113P. Some parts of the second sacrificial layer 111 are removed through an etch process using the first protection patterns 113P as an etch mask, thereby forming the second sacrificial patterns 111P that are separated from each other and expose sidewalls of the first sacrificial layers 103. The second sacrificial patterns 111P are formed on the first sacrificial layers 103.

Figure 4D:
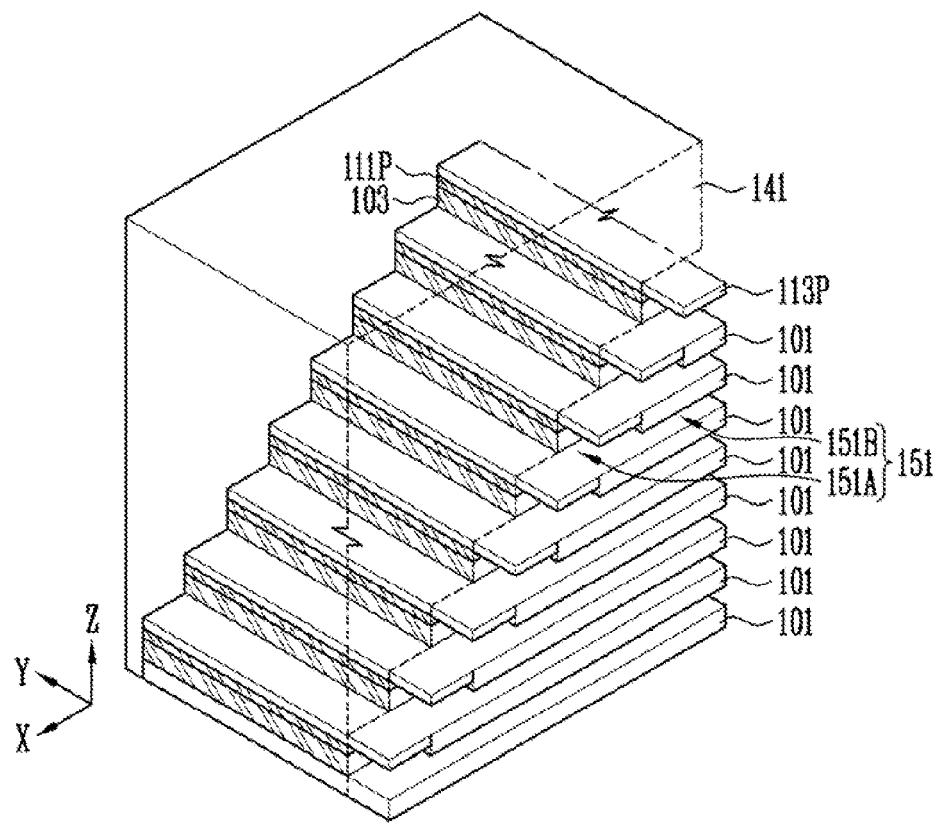

Referring to FIG. 4D, a second interlayer dielectric 141 is formed to cover the stepped structure including the first interlayer dielectrics 101 each alternately stacked on each of the first sacrificial layers 103, and the second sacrificial patterns 111P. In FIG. 4D, a part of the second interlayer dielectric 141 that clearly shows openings 151 is illustrated. The second interlayer dielectric 141 may be formed of an oxide layer. The surface of the second interlayer dielectric 141 may be flattened by a planarization process.

Subsequently, slits (not shown) are formed to pass through the second interlayer dielectric 141, the first protection patterns 113P, the second sacrificial patterns 111P, the first sacrificial layers 103, and the first interlayer dielectrics 101, thereby opening sidewalls of the second sacrificial patterns 111P and the first sacrificial layers 103. The slits may include the first slit SL1 and the second slit SL2 described above in FIG. 1. The shape and number of slits are not limited and may be provided in various forms.

Subsequently, the second sacrificial patterns 111P and the first sacrificial layers 103 that are exposed through sidewalls of the slits are removed through an etch process, thereby forming the openings 151. Each of the openings 151 includes a pad pattern region 151A and a line pattern region 151B. The pad pattern region 151A is connected to an end portion of the line pattern region 151B. Although not shown, the line pattern region 151B extends to the cell area (CELL in FIG. 1), and includes the first region P1 adjacent to the channel layer (CH in FIGS. 1 and 2) and the first sacrificial layer 103, and the second region (P2 in FIG. 1) connected to the first region (P1 in FIG. 1), and opens sidewalls of the channel layer CH.

Figure 5A:
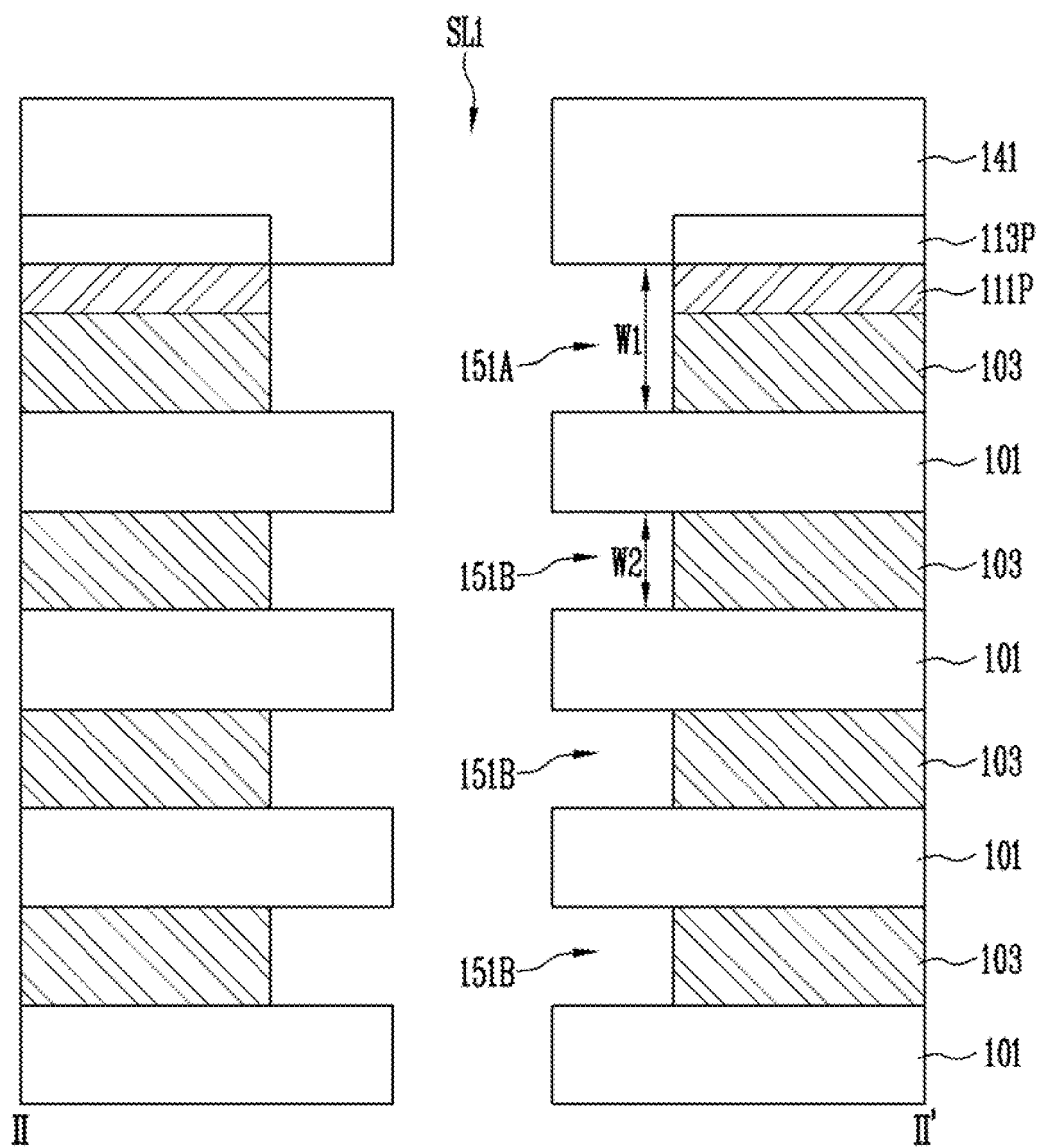

Referring to FIG. 5A, the interlayer dielectrics 141 and 101 are formed to be stacked while interposing openings each including the line pattern region 151B and the pad pattern region 151A, separated by the slit SL1, and passed by the channel layer CH shown in FIGS. 1 and 2. The pad pattern region 151A is a region defined by removing some portion of each of a second sacrificial pattern 111P and a first sacrificial layer 103 overlapping each other. The line pattern region 151B is a region defined by removing some portion of the first sacrificial layer 103 that does not overlap the second sacrificial pattern 111P. Accordingly, a vertical width W1 of the pad pattern region 151A is greater than a vertical width W2 of the line pattern region 151B.

Figure 5B:
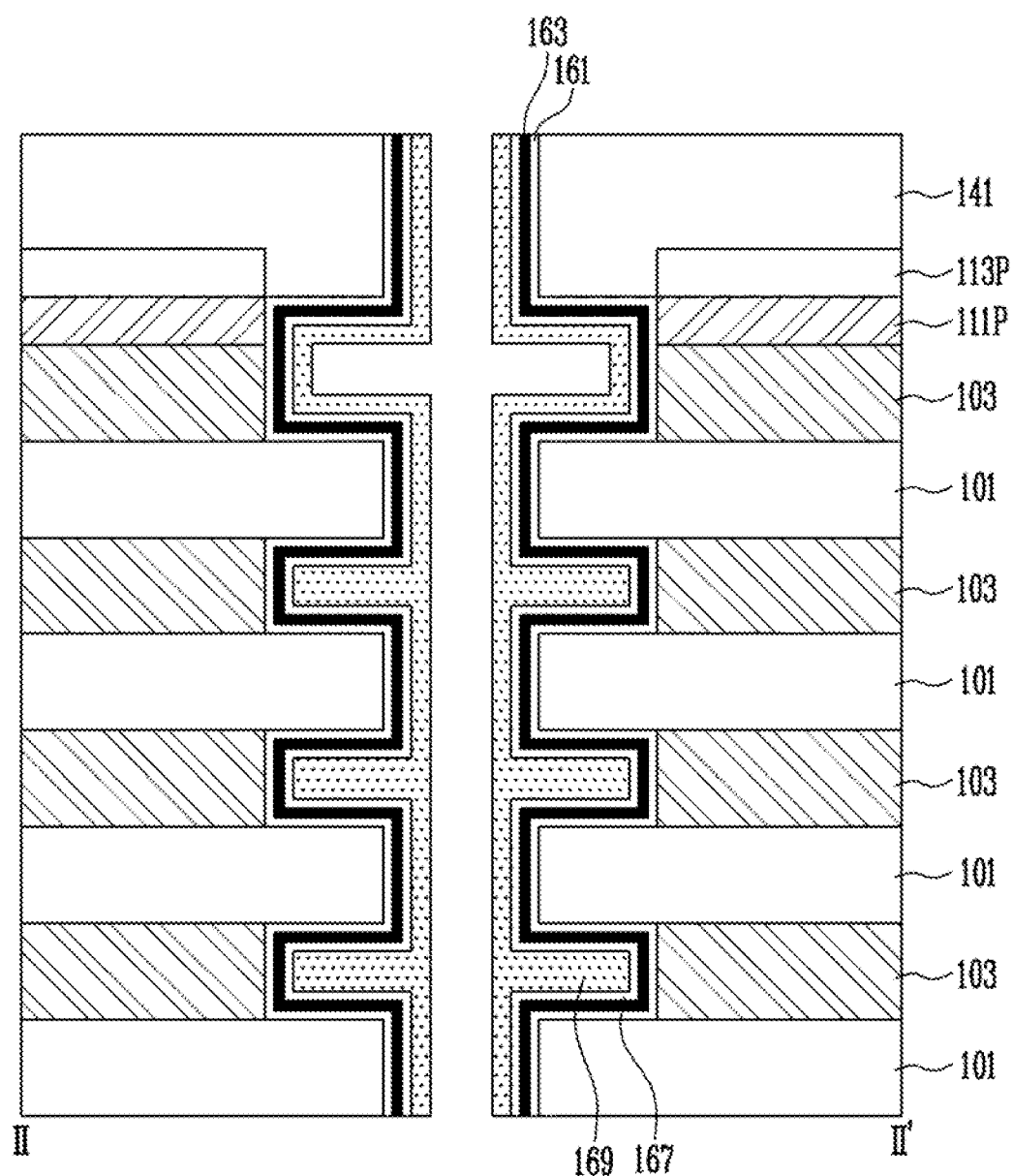

Referring to FIG. 5B, a barrier layer 163 is formed along the surfaces of the openings each including the line pattern region 151B and the pad pattern region 151A and the surface of the slit SL1 shown in FIG. 5A. Before the barrier layer 163 is formed, the blocking dielectric layer 161 may be further formed. The blocking dielectric layer 161 may be formed of an oxide layer such as $Al_2O_3$. The barrier layer 163 may be formed of a metal nitride material, for example, TiN, that may block a metal material.

Subsequently, a reaction preventing layer 167 is formed on the barrier layer 163 along the surfaces of the openings 151A and 151B and the slit SL1. The reaction preventing layer 167 is formed to prevent the barrier layer 163 from reacting with the second protection layer 169, which is to be formed subsequently, and the reaction preventing layer 167. The reaction preventing layer 167 includes an oxide layer.

The second protection layer 169 is formed on the reaction preventing layer 167. The second protection layer 169 is formed to have a thickness capable of filling the line pattern region 151B, which is relatively narrow, while opening the center region of the pad pattern region 151A, which is relatively wide. The second protection layer 169 is formed of a material that is etched by an etching substance different from an etching substance that causes damage to the barrier layer 163. That is, the second protection layer 169 may have an etch selectivity with respect to the barrier layer 163. Additionally, the second protection layer 169 may have an etch selectivity with respect to the reaction preventing layer 167. For example, the second protection layer 169 may include polysilicon that has an etch rate 50 times than the reaction preventing layer 167 formed of an oxide layer and may be removed by an etching substance different than $H_2SO_4$ that causes loss to the barrier layer 163 formed of TiN. The second protection layer 169 is prevented from making contact with the barrier layer 163 by the reaction preventing layer 167. Accordingly, some thickness of the barrier layer 163 is prevented from reacting with the second protection layer 169, thereby securing a metal blocking function of the barrier layer 163.

Figure 5C:
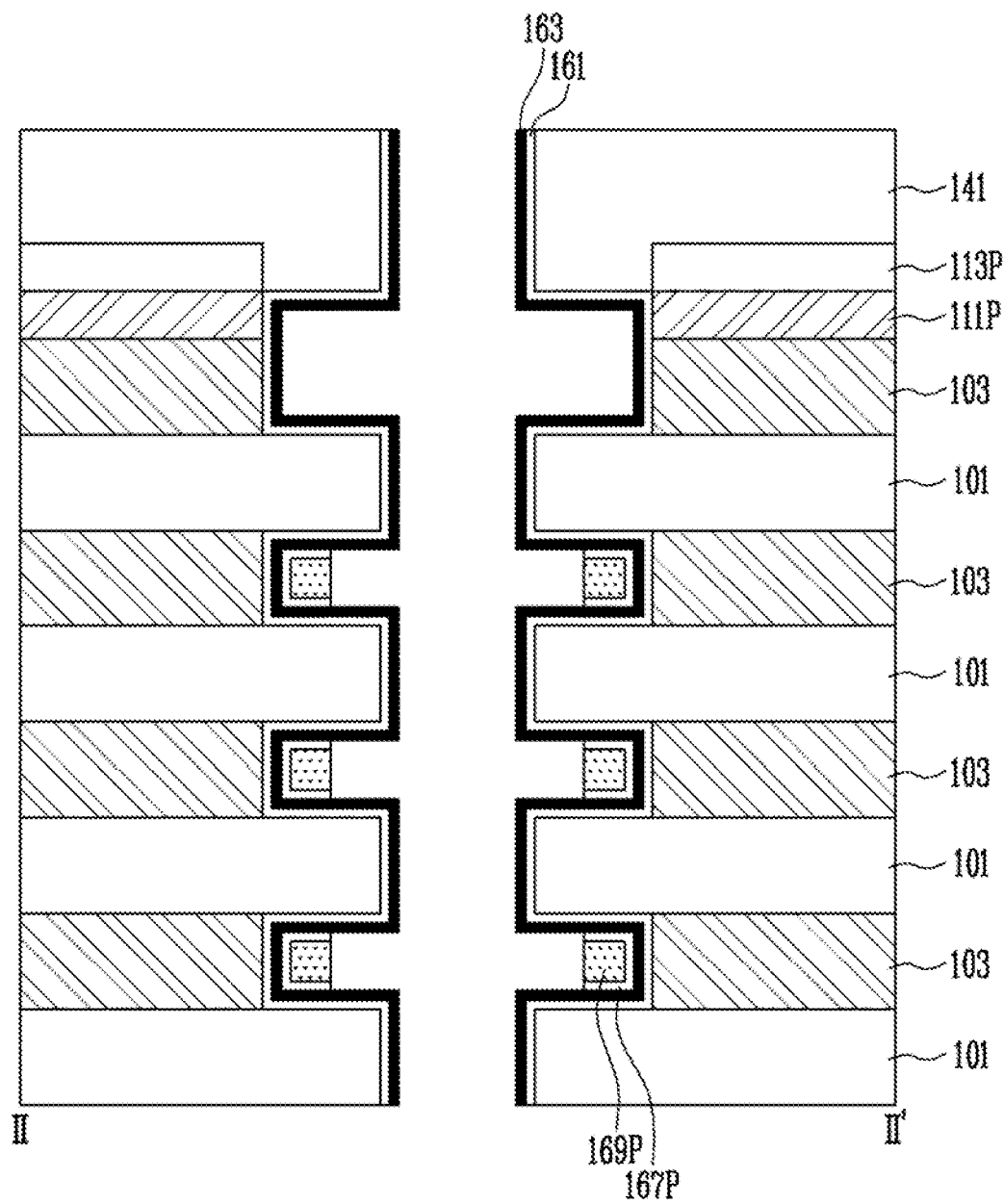

Referring to FIG. 5C, the second protection layer 169 is etched using an etching substance that selectively etches the second protection layer 169 relative to the reaction preventing layer 167 and the barrier layer 163, thereby removing a portion of the second protection layer 169 formed in the pad pattern region 151A, the slit SL1, and the second region (P2 in FIG. 1) of the line pattern region 151B. As a result, the second protection pattern 169P remains in the first region (P1 in FIG. 1) of the line pattern region 151B. As described above with reference to FIG. 5B, the second protection layer 169 is formed to be filled in the center region of the line pattern region 151B while opening the center region of the pad pattern region 151A, so that the etch substance for the second protection layer 169 has difficulty infiltrating inside of the line pattern region 151B while easily infiltrating inside of the pad pattern region 151A. Accordingly, the second protection pattern 169P may remain in the line pattern region 151B, and the second protection layer 169 inside the pad pattern region 151A may be completely removed. When the second protection pattern 169P is formed, an etching substance having a higher etch rate for the second protection layer 169 relative to the barrier layer 163 may be used rather than using $H_2SO_4$, thereby preventing the barrier layer 163 from being damaged.

Subsequently, the reaction preventing layer 167 exposed by the second protection pattern 169P is removed by a wet etch or a dry etch, thereby forming the reaction preventing pattern 167P. A portion of the reaction preventing layer 167 formed in the pad pattern region 151A, the slit SL1, and the second region (P2 in FIG. 1) of the line pattern region 151B is removed, so that the reaction preventing pattern 167P remains in the first region (P1 in FIG. 1) of the line pattern region 151B.

Figure 5D:
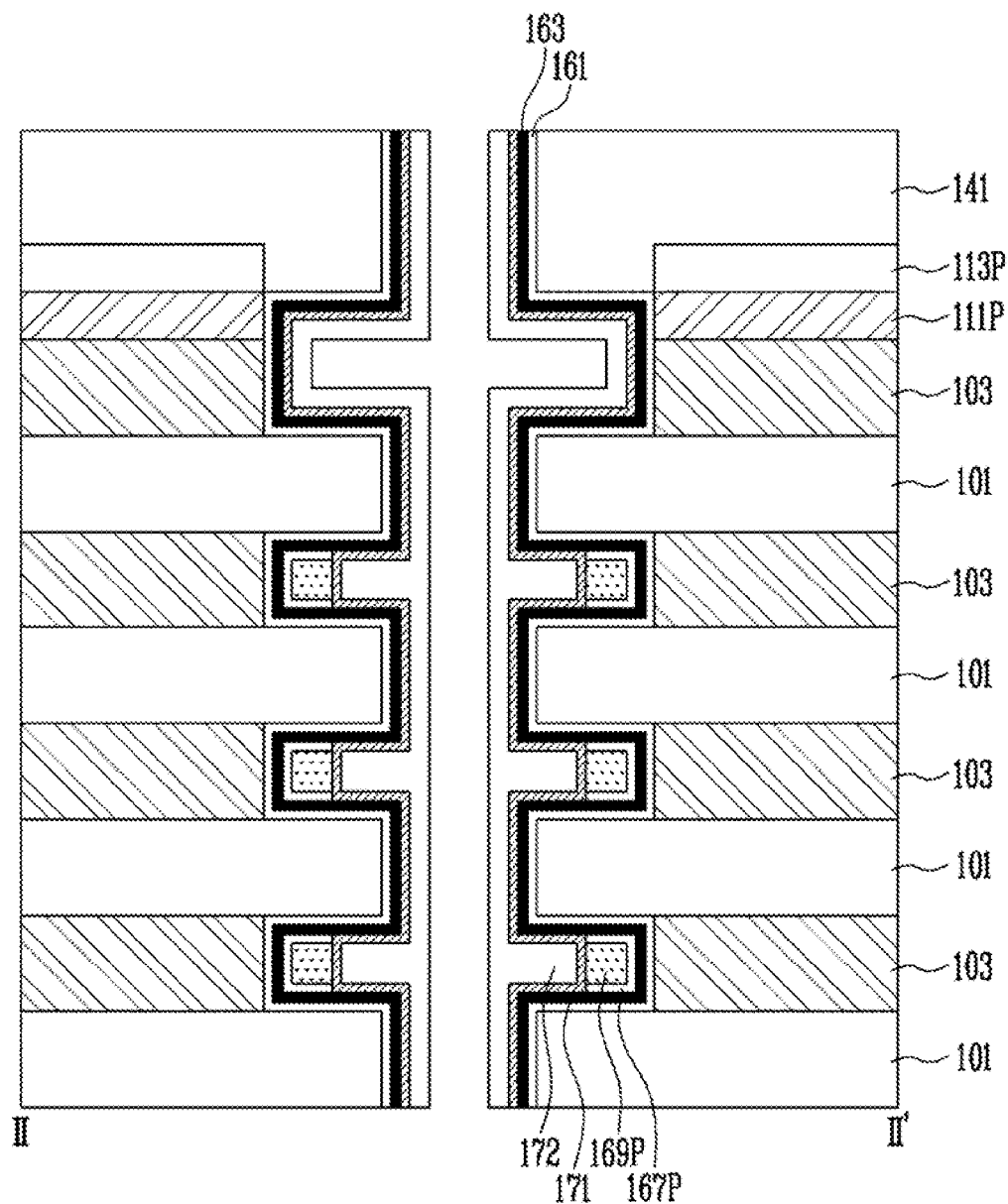

Referring to FIG. 5D, a first metal seed layer 171 is formed along a surface of the barrier layer 163 that is open within the pad pattern region 151A shown in FIG. 5A and the slit SL1 shown in FIG. 5A and a surface of the second region (P2 in FIG. 1) of the line pattern region 151B that is open shown in FIG. 5A. The first metal seed layer 171 is formed of a metal layer having a resistance lower than that of polysilicon and is uniformly deposited. For example, the first metal seed layer 171 may include tungsten. When the first metal seed layer 171 is deposited, a gas may be generated. This gas may damage the barrier layer 163. If the barrier layer 163 adjacent to the channel layer (CH in FIG. 2) is damaged, the memory cell characteristics may be degraded. According to an embodiment of the present invention, the barrier layer 163 adjacent to the channel layer (CH in FIG. 2) is blocked by the second protection pattern 169P, thereby preventing the memory cell characteristics from being degraded due to the damage of the barrier layer 163.

Thereafter, a first mask layer 172 is formed on the first metal seed layer 171. The first mask layer 172 may be formed of an oxide layer having poor step coverage characteristics. If the first mask layer 172 is formed of an oxide layer, the first mask layer 172 may be formed at a temperature of 100° C. or below to prevent the first metal seed layer 171 from being oxidized. The first mask layer 172 is formed to have a thickness capable of opening the center region of the pad pattern region 151A having a relatively greater width while filling the second region (P2 in FIG. 1) of the line pattern region 151B that is open with a relatively narrow width.

Figure 5E:
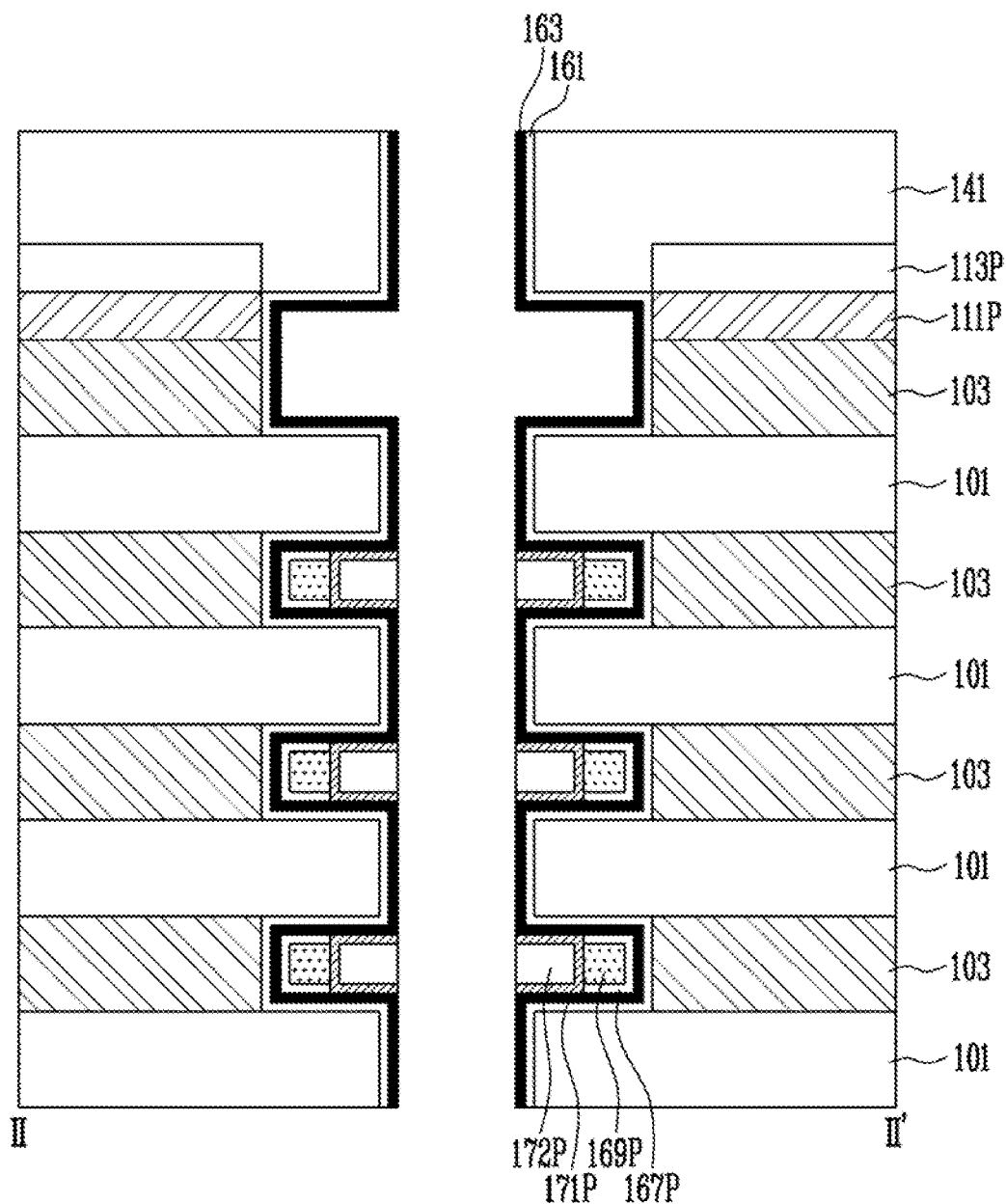

Referring to FIG. 5E, the first mask layer 172 shown in FIG. 5D is etched through a wet etch or a dry etch, so that a portion of the first mask layer 172 that is formed in the pad pattern region 151A and the slit SL1 is removed. As a result, a first mask pattern 172P remains in the second region (P2 in FIG. 1) of the line pattern region 151B shown in FIG. 5A. As described above with reference to FIG. 5D, the first mask layer 172 is formed to fill the center region of the line pattern region 151B while opening the center region of the pad pattern region 151A, so that an etch substance for the first mask layer 172 has difficulty infiltrating inside of the line pattern region 151B while easily infiltrating inside of the pad pattern region 151A. Accordingly, the first mask pattern 172P remains in the line pattern region 151B, and the first mask layer 172 inside the pad pattern region 151A is completely removed.

Subsequently, a portion of the first metal seed layer 171 exposed at the pad pattern region 151A shown in FIG. 5A and the slit SL1 shown in FIG. 5A is removed using the first mask pattern 172P as an etching barrier, thereby forming the first metal seed pattern 171P in the second region (P2 In FIG. 1) of the line pattern region 151B shown in FIG. 5A. The etch process of forming the first metal seed pattern 171P is performed on the first metal seed layer 171 uniformly deposited and having a small thickness by using the first mask pattern 172P as an etch barrier. Accordingly, damage of the first metal seed layer 171 in the line pattern region 151B occurring during an etch process for forming the first metal seed pattern 171P is minimized.

Figure 5F:
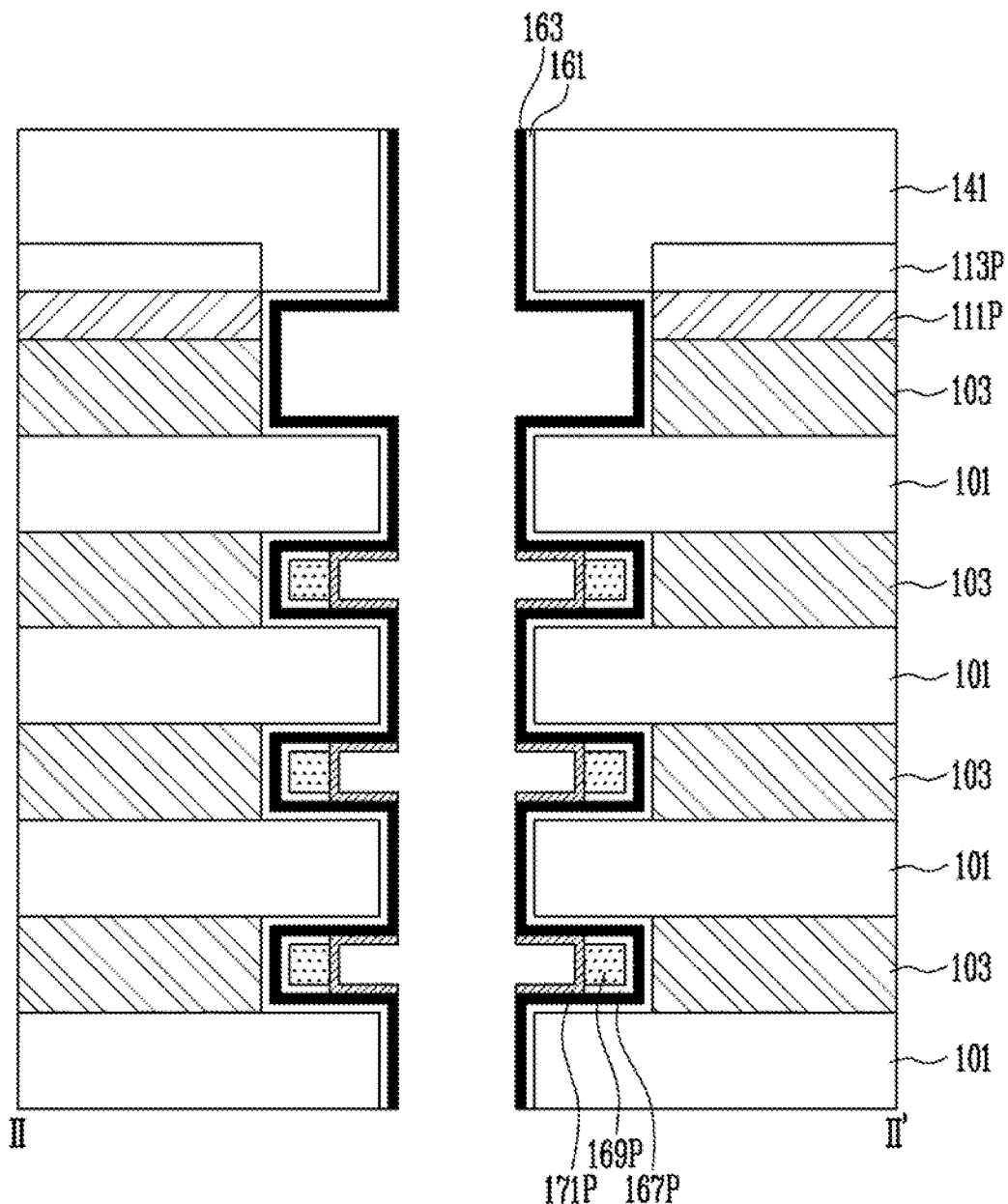

Referring to FIG. 5F, the first mask pattern 172P shown in FIG. 5E is removed so that the second region of the line pattern region 151B shown in FIG. 5 A is open and the first metal seed pattern 171P is exposed.

Referring to FIG. 5G, the first metal layer 173 is selectively grown from the first metal seed pattern 171P, thereby filling the second region (P2 in FIG. 1) of the line pattern region 151B shown in FIG. 5A, with the first metal layer 173. According to an embodiment of the present invention, the second region (P2 in FIG. 1) of the line pattern region 151B is filled with the first metal layer 173 by performing a selective growth process on the second region (P2 in FIG. 1) of the line pattern region 151B, thereby removing the need for an etch process of separately forming the first metal layer 173 in each line pattern region 151B. For example, to simultaneously fill the line pattern region 151B and the pad pattern region 151A, which have different sizes, with the first metal layer 173, the first metal layer 173 is excessively grown in the line pattern region 151B to be filled in the pad pattern region 151A shown in FIG. 5A. As a result, an additional etch process needs to be performed to remove a portion of the first metal layer 173 existing outside the line pattern region 151B such that the first metal layers 173 are separated by the line pattern regions 151B. However, according to an embodiment of the present invention, the first metal layer 173 is prevented from being formed in the pad pattern region 151A, thereby omitting the etch process performed on the first metal layer 173. Accordingly, the first metal layer 173 inside the line pattern region 151B is prevented from being damaged due to an etch process that may be performed on the first metal layer 173, thereby securing the area of the first metal layer 173 inside the line pattern region 151B while lowering the resistance of the line pattern (LP in FIG. 2).

Figure 5H:
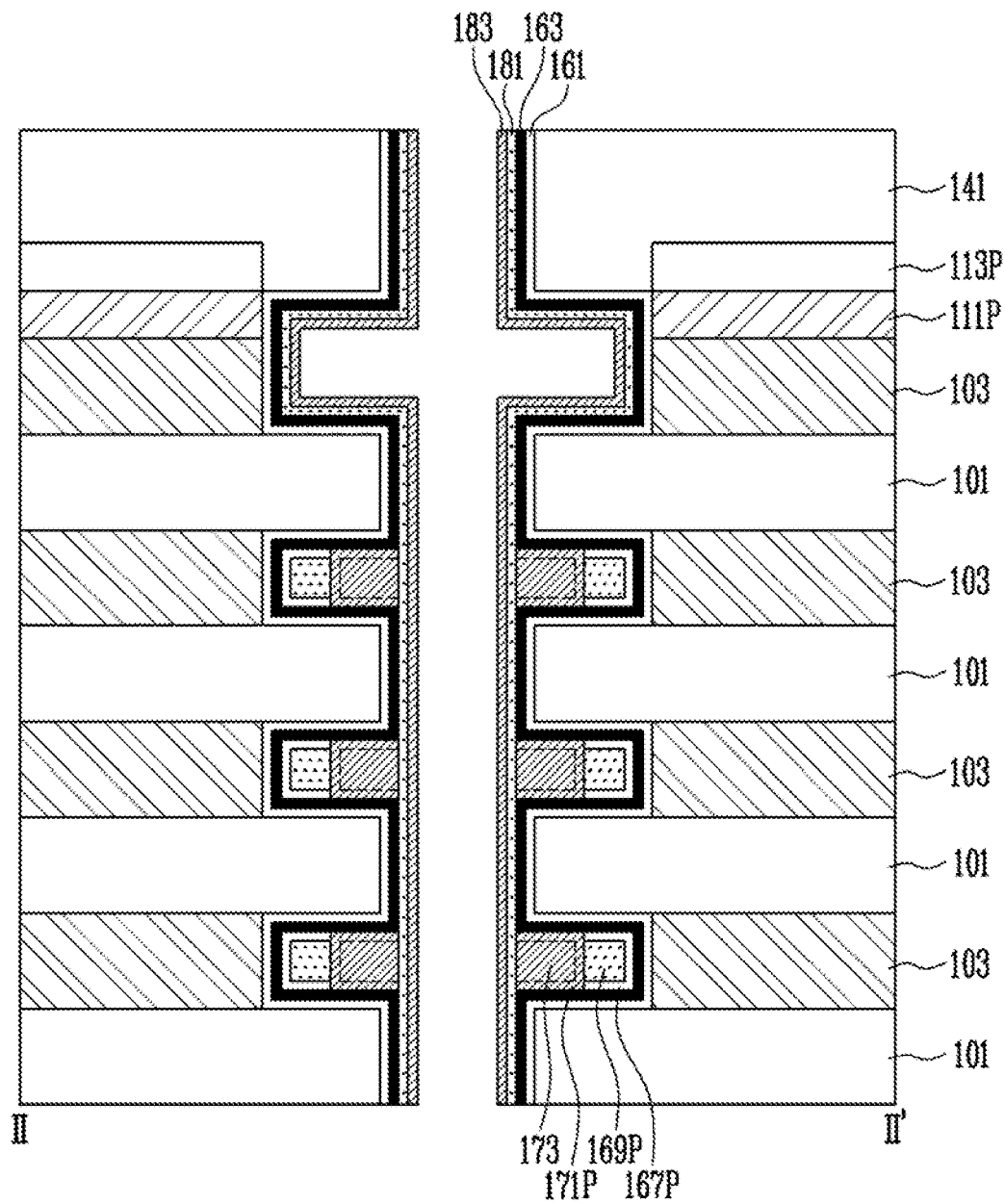

Referring to FIG. 5H, after the first metal layer 173 is formed, a reacting layer 181 that forms an etch stop layer by reacting with the barrier layer 163 is formed. The reacting layer 181 is uniformly deposited along a surface of the barrier layer 163 exposed in the pad pattern region 151A shown in FIG. 5A and the slit SL1 shown in FIG. 5A and a surface of the first metal layer 173 in the line pattern region 151B shown in FIG. 5A. The reacting layer 181 may include polysilicon forming $TiNSi_x$, where x is a natural number, having an etch selectivity with respect to metal by reacting with the barrier layer 163 formed of TiN.

A second metal seed layer 183 is formed along a surface of the reacting layer 181. The second metal seed layer 183 is uniformly deposited and is formed of a metal layer having a resistance lower than that of polysilicon. For example, the second metal seed layer 183 may include tungsten.

Figure 5I:
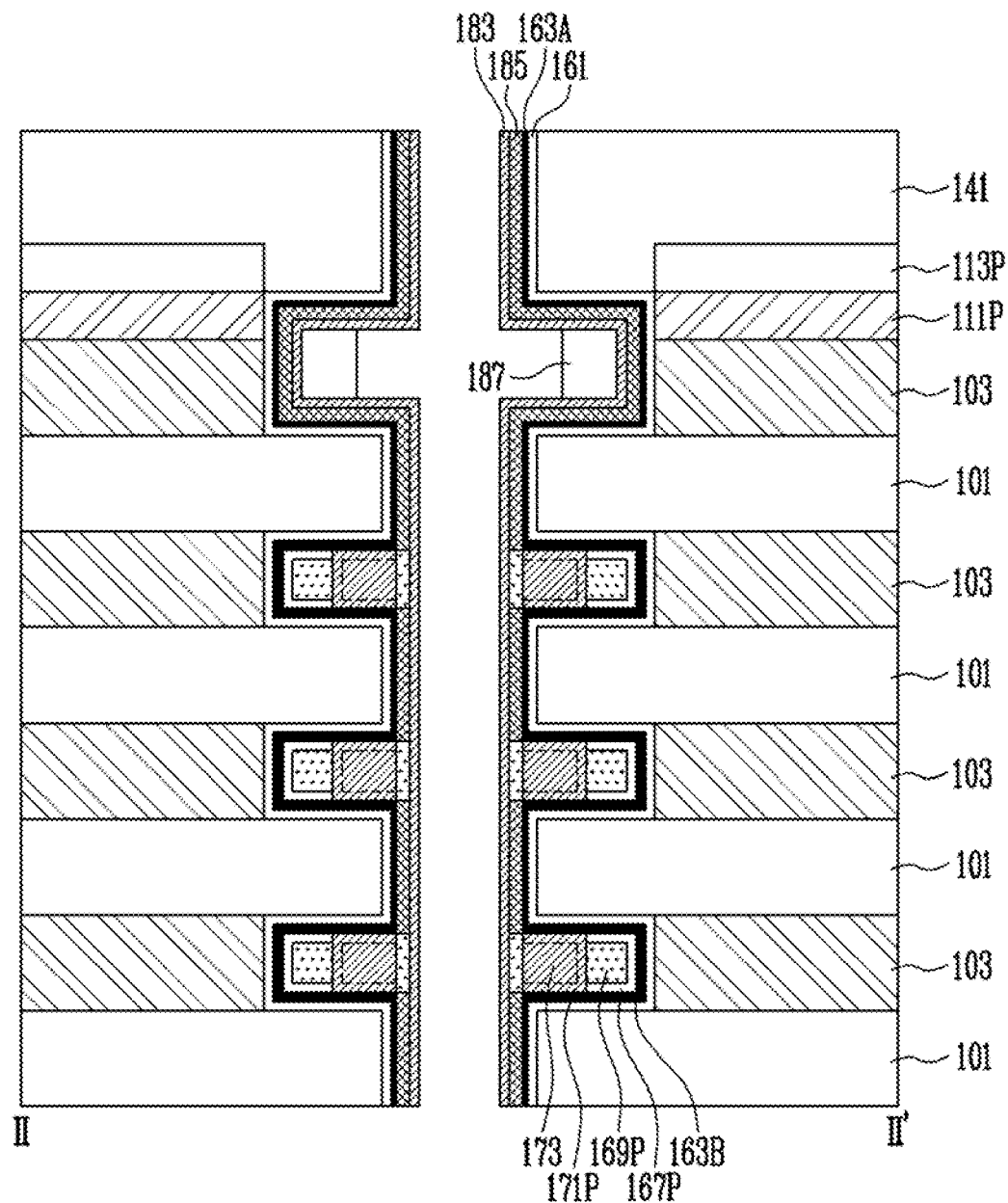

Referring to FIG. 5I, the reacting layer 181 reacts with the barrier layer 163 shown in FIG. 5H by some thickness of the barrier layer 163, thereby forming an etch stop layer 185. The etch stop layer 185 may include $TiNSi_x$ that is formed by reacting the barrier layer 163 formed of TiN with the reacting layer 181 formed of polysilicon. Due to the etch stop layer 185 formed as such, a barrier layer 163A having a thickness less than an initial thickness of the barrier layer 163 remains in the slit SL1 and the pad pattern region 151A shown in FIG. 5A, and a barrier layer 163B having the same thickness as the initial thickness of the barrier layer 163 remains in the line pattern region 151B shown in FIG. 5A.

Subsequently, a second mask pattern 187 is formed on the second metal seed layer 183 in the pad pattern region 151A. The second mask pattern 187 is formed by forming an oxide layer having superior step coverage on the second metal seed layer 183 to be filled in the pad pattern region 151A, and then removing an oxide layer inside the slit SL1 through a wet etch process or a dry etch process.

Figure 5J:
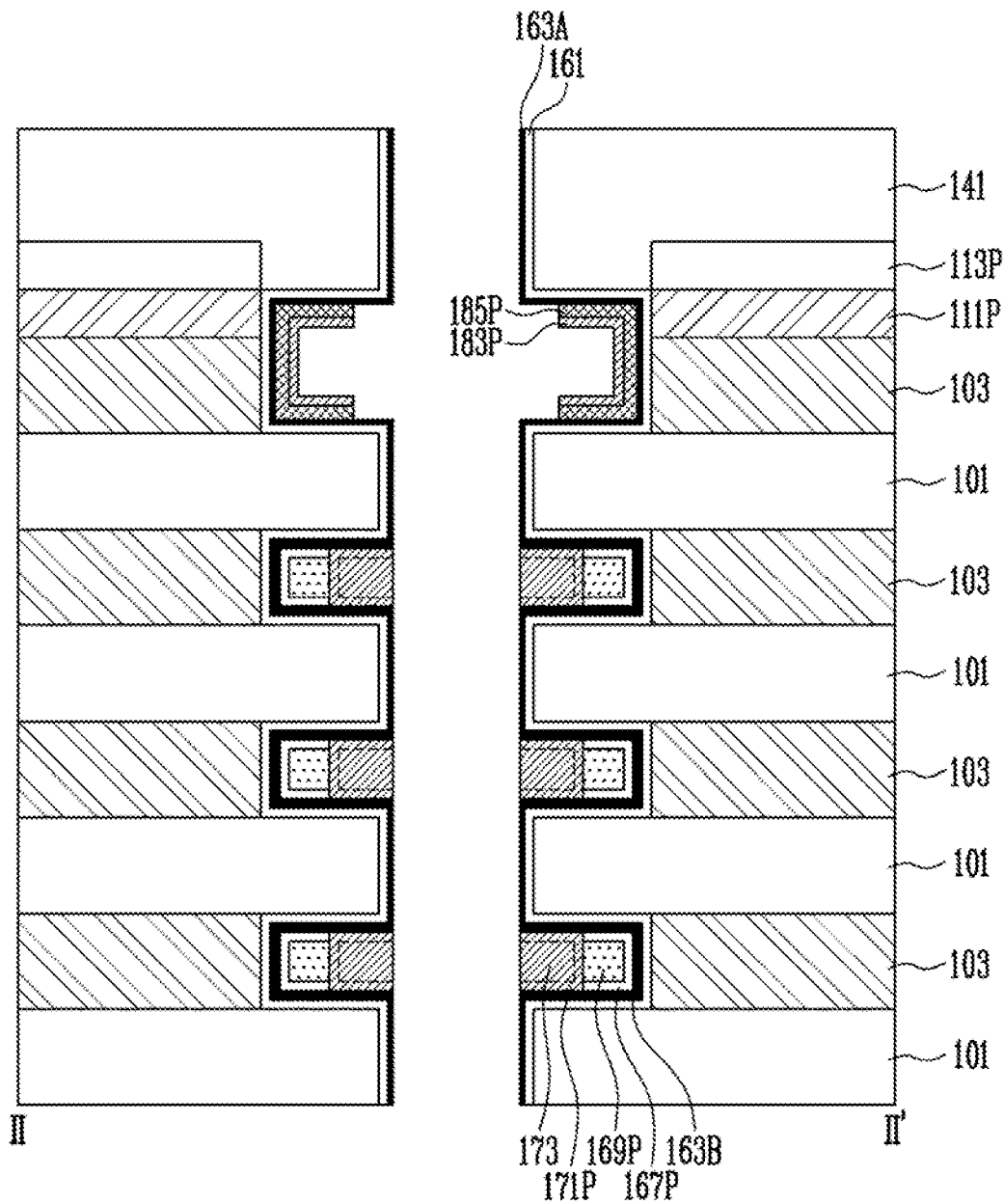

Referring to FIG. 5J, a portion of the second metal seed layer 183 shown in FIG. 5I exposed in the slit SL1 shown in FIG. 5A is removed by using the second mask pattern 187 shown in FIG. 5I as an etch barrier, thereby forming the second metal seed pattern 183P in the pad pattern region 151A shown in FIG. 5A. An etch process to form the second metal seed pattern 183P may be performed through a wet etch process or a plasma etch process. As described above in FIG. 5I, the etch stop layer 185 shown in FIG. 5I has an etch selectivity with respect to the second metal seed layer 183, and thus serves as a wet etch stop layer during a wet etch process. Accordingly, the etch stop layer 185 prevents the first metal layer 173 in the line pattern region 151B shown in FIG. 5B from being damaged during an etch process for the second metal seed layer 183.

Subsequently, the second mask pattern 187, a portion of the etch stop layer 185 that is not blocked by the second metal seed pattern 183P, and the remaining reacting layer 181 shown in FIG. 5H are removed. Accordingly, the etch stop pattern 185P remains at a lower side of the second metal seed pattern 183P in the pad pattern region 151A.

Figure 5K:
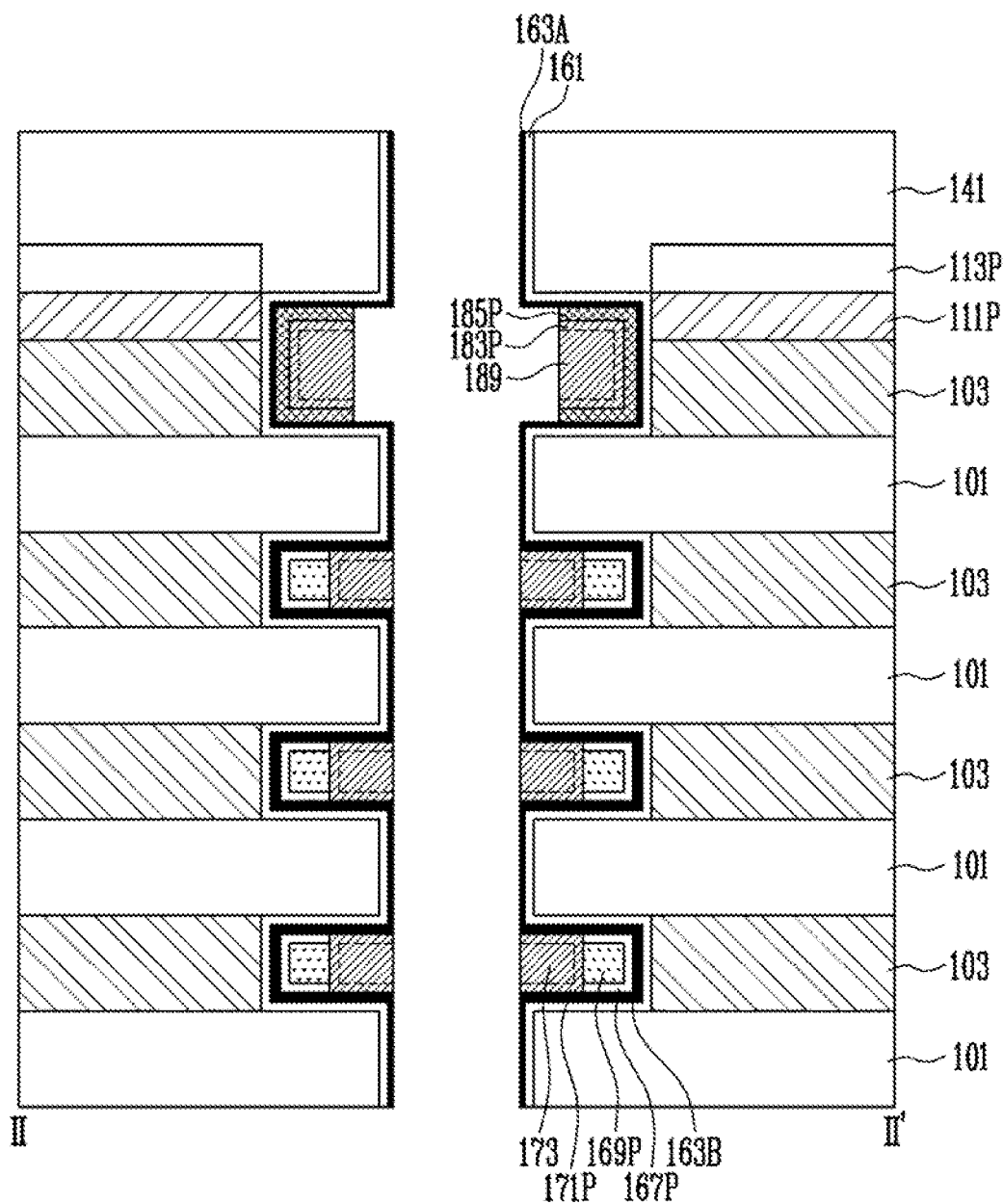

Referring to FIG. 5K, the second metal layer 189 is selectively grown from the second metal seed pattern 183P to be filled in the pad pattern region 151A shown in FIG. 5A. According to an embodiment of the present invention, the pad pattern region 151A is filled with the second metal layer 189 through a selective growth process, so there is no need for an additional etch process to be performed to leave the second metal layer 189 in the pad pattern region 151A.

Figure 5L:
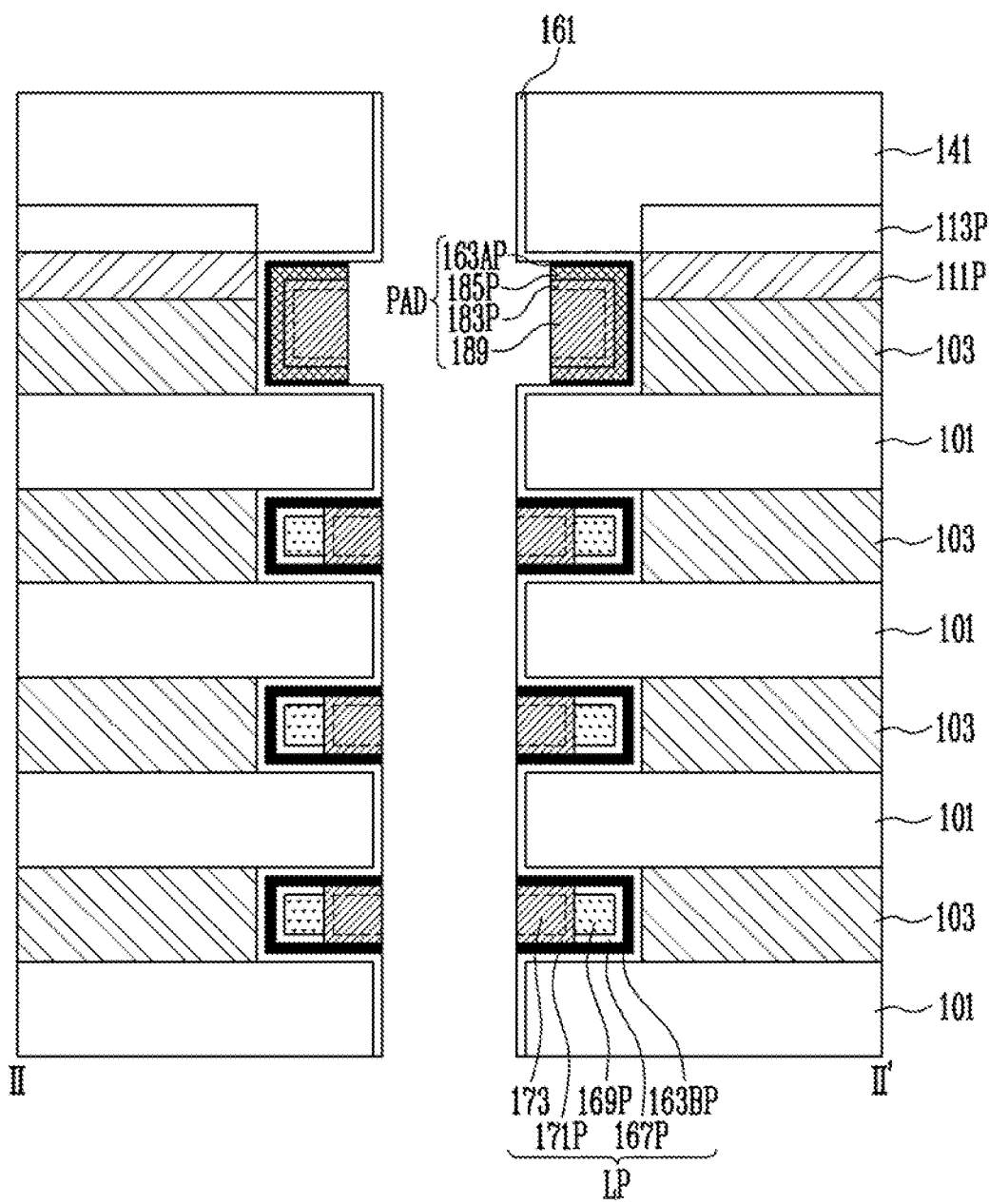

Referring to FIG. 5L, portions of the barrier layer 163A shown in FIG. 5K exposed by the first metal layer 173 and the second metal layer 189 are removed, thereby forming a barrier pattern. The barrier pattern includes the first part 163BP remaining in the line pattern region 151B shown in FIG. 5A, and the second part 163AP remaining in the pad pattern region 151A shown in FIG. 5A. Accordingly, a pad pattern PAD and a line pattern LP that have different structures from each other are formed.

A manufacturing method according to the present invention enables the first part 163BP of the barrier pattern adjacent to the channel layer (CH in FIG. 2) to be protected by the reaction preventing pattern 167P and the second protection pattern 169P without being directly exposed to an etch substance that is used to form the barrier pattern. An embodiment of the present invention prevents the characteristics of the memory cells from being degraded due to the damage of the first part 163BP of the barrier pattern adjacent to the channel layer CH.

A manufacturing method according to an embodiment of the present invention controls a metal layer growth process of filling a pad pattern region separately from a metal layer growth process of filling a line pattern region since the pad pattern region and the line pattern region are each filled with metal layers separately formed through a selective growth method. Accordingly, even if the size of the pad pattern region is different from the size of the line pattern region, metal layer growth processes to fit the sizes of the pad pattern region and the line pattern region are performed so that an etch process of separating a metal layer between regions is omitted. As a result, a metal layer in the pad pattern region and a metal layer in the line pattern region are prevented from being damaged during the etch process of separating metal layers by the regions. According to an embodiment of the present invention, the inside of the pad pattern region or the inside of the line pattern region is prevented from being opened due to the metal layer being damaged. Accordingly, an embodiment of the present invention prevents a punch phenomenon in which a contact plug connected to the pad pattern region passes through the pad pattern region being opened due to the damage of the metal layer, thus causing a bridge between the line patterns.

Figure 6:
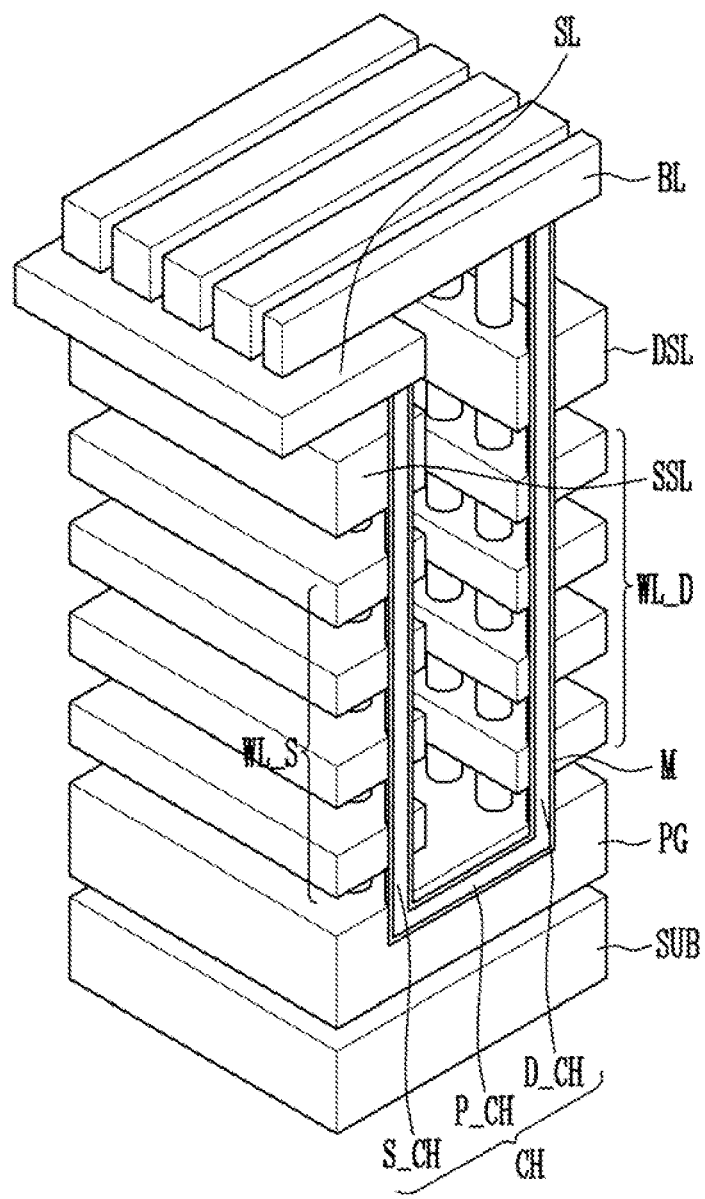
FIGS. 6 and 7 are perspective views illustrating cell structures of a semiconductor devices according to exemplary embodiments of the present invention.
Figure 7:
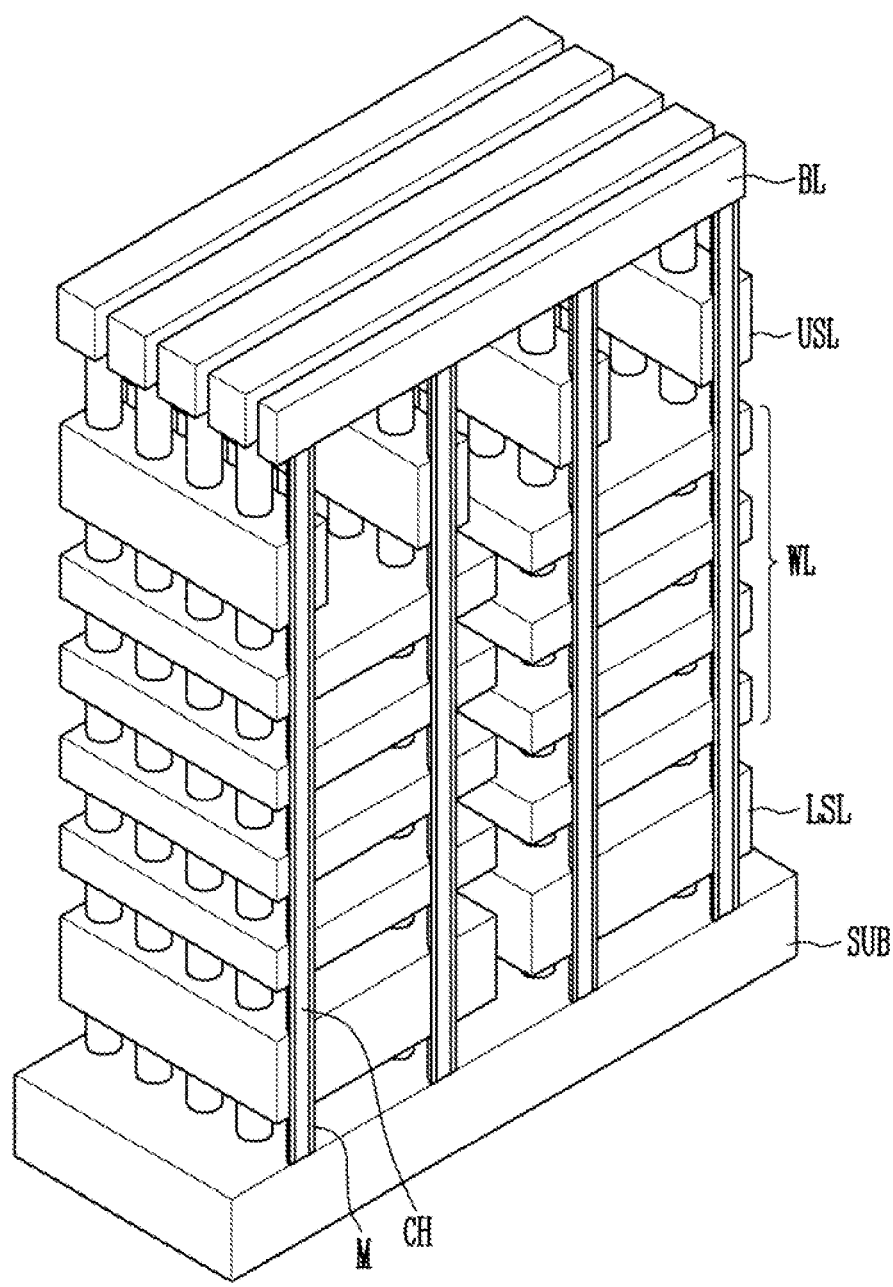

FIGS. 6 and 7 are perspective views illustrating cell structures of a semiconductor device according to exemplary embodiments of the present invention.

FIG. 6 illustrates a 3D memory string formed by memory cells arranged along a U-type channel layer CH.

Referring to FIG. 6, a cell structure includes a pipe gate PG, word lines WL_D and WL_S, at least one first select line SSL, and at least one second select line DSL that are stacked on a substrate SUB. The first select line SSL may be a source select line, and the second select line DSL may be a drain select line. The cell structure includes a U-type channel layer CH and multilayer dielectrics M surrounding the channel layer CH. The configuration of the multilayer dielectrics M is the same as that shown in FIG. 2.

The channel layer CH includes a pipe channel layer P_CH, a source side channel layer S_CH and a drain side channel layer D_CH that protrude from the pipe channel layer P_CH. The drawing shows an example in which a source side channel layer S_CH and a drain side channel layer D_CH paired with the source side channel layer S_CH are connected to a pipe channel layer P_CH. However, depending on the shape of the memory string, two or more source side channel layers S_CH may be connected to a pipe channel layer P_CH or two or more drain side channel layers D_CH may be connected to a pipe channel layer P_CH.

The source side channel layer S_CH passes through the source side word lines WL_S and the first select line SSL, and the drain side channel layer D_CH passes through the drain side word lines WL_D and the second select line DSL. The source side channel layer S_CH is connected to a source line SL, and the drain side channel layer D_CH is connected to a bit line BL.

According to the structure described above, at least one drain select transistor, memory cells, and at least one source select transistor that are connected in series form a single memory string while being arranged in a U-shape.

The cell structure described above may be formed by forming the pipe gate PG and then using the processes described through FIGS. 4A to 5L.

FIG. 7 shows a 3D memory string formed by memory cells arranged along a straight-type channel layer CH.

Referring to FIG. 7, a cell structure includes at least one first select line LSL, word lines WL, and at least one second select line USL that are sequentially stacked on a substrate SUB including a source region. The cell structure includes a channel layer CH that is connected to the substrate SUB and is formed as a straight type, and multilayer dielectrics M surrounding the channel layer CH. The configuration of the multilayer dielectrics M is the same as that shown in FIG. 2. The channel layer CH may be connected between the substrate SUB and bit lines BL. In particular, the channel layer CH may be connected to the source region of the substrate SUB.

The word lines WL between the first select line LSL and the second select line USL may have the same structure as that of the line patterns LP shown in FIGS. 1 and 2. The word lines WL extend to a contact area and are connected to the pad patterns PAD described in FIGS. 1 to 3. The first select line LSL and the second select line USL may have the same structure as that of the word lines WL, or have a different structure from that of the word lines WL.

According to the structure described above, at least one first select transistor, memory cells, and at least one second select transistor that are connected in series form a single memory string while being stacked in a straight line.

The cell structure described above may be formed by using the processes described through FIGS. 4A to 5L.

Figure 8:
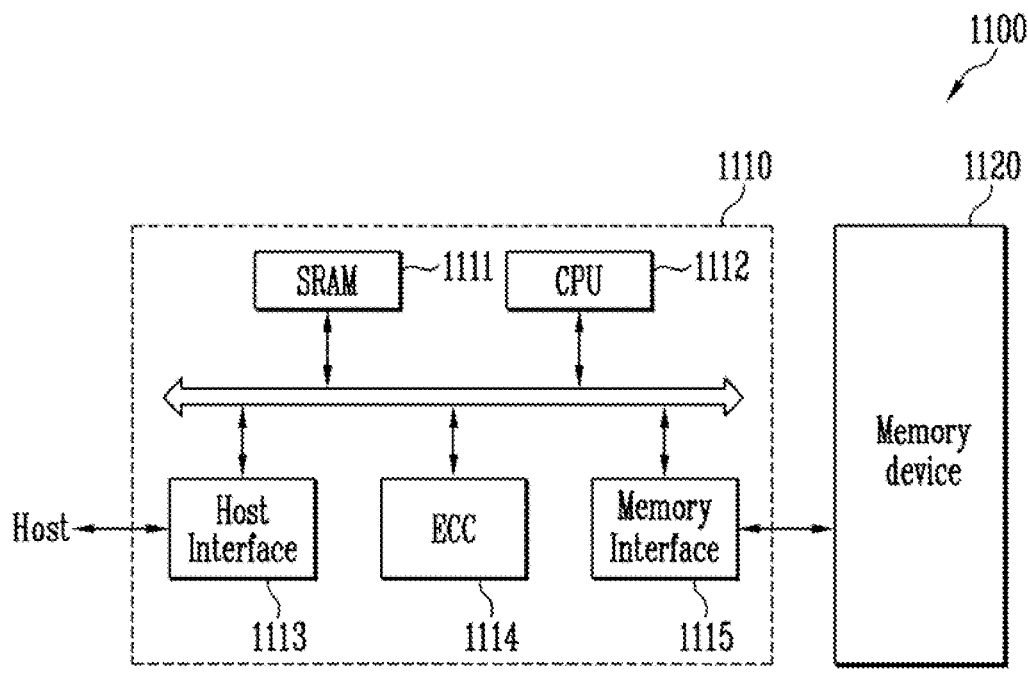
FIG. 8 is a block diagram illustrating a configuration of a memory system according to an exemplary embodiment of the present invention.

FIG. 8 is a block diagram illustrating a configuration of a memory system according to an exemplary embodiment of the present invention Referring to FIG. 8, a memory system 1100 according to an exemplary embodiment of the present invention includes a memory device 1120 and a memory controller 1110.

The memory device 1120 has the structure that has been described in the exemplary embodiments with reference to FIGS. 1 to 7. In addition, the memory device 1120 may be a multi-chip package composed of a plurality of flash memory chips.

The memory controller 1110 is configured to control the memory device 1120, and may include a Static RAM ("SRAM") 1111, a central processing unit ("CPU") 1112, a host interface 1113, an error check and correct circuit ("ECC") 1114, and a memory interface 1115. The SRAM 1111 is used as an operating memory for the CPU 1112, the CPU 1112 performs overall control operations for data exchange of the memory controller 1110, and the host interface 1113 is provided with a data exchange protocol of a host connected to the memory system 1100. In addition, the ECC 1114 detects and corrects errors included in data read from the memory device 1120, and the memory interface 1115 performs interfacing with the memory device 1120. The memory controller 1110 may further include a read only memory (ROM) storing code data for interfacing with the host.

The memory system 1100 having the above structure may be a memory card or a solid-state disk ("SSD") each having the memory device 1120 coupled to the memory controller 1110. For example, when the memory system 1100 is an SSD, the memory controller 1110 may communicate with an outside (for example, a host) through one of various interface protocols including a universal serial bus (USB) protocol, a multimedia card (MMC) protocol, a peripheral component interconnect-Express (PCI-E) protocol, a serial-advanced technology attachment (SATA) protocol, a parallel-ATA (PATA) protocol, a small computer system interface (SCSI) protocol, an enhanced small disk interface (ESDI) protocol, an integrated drive electronics (IDE) protocol, and the like.

Figure 9:
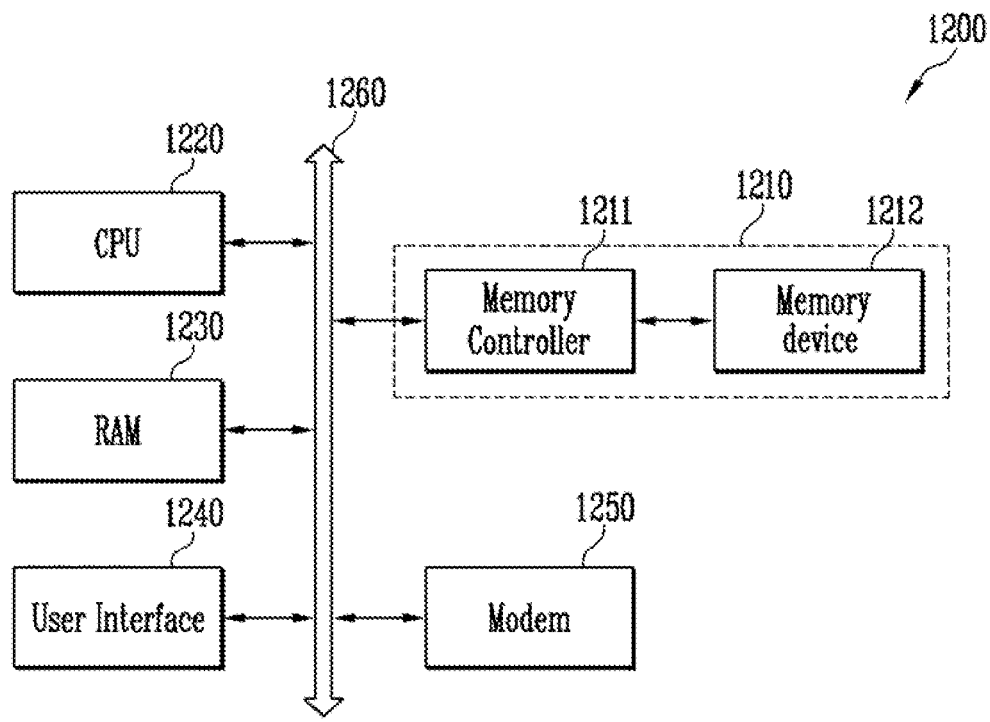
FIG. 9 is a block diagram illustrating a configuration of a computing system according to an exemplary embodiment of the present invention.

FIG. 9 is a block diagram illustrating a configuration of a computing system according to an exemplary embodiment of the present invention.

Referring to FIG. 9, a computing system 1200 according to an exemplary embodiment of the present invention includes a CPU 1220, a random access memory (RAM) 1230, a user interface 1240, a modem 1250, and a memory system 1210 that are electrically connected to a system bus 1260. In addition, when the computing system 1200 is a mobile device, the computing system 1200 may further include a battery configured to supply the computing system 1200 with an operating voltage, as well as an application chipset, a camera image processor, and a mobile DRAM.

The memory system 1210 may include a memory device 1212 and a memory controller 1211 as described with reference to FIG. 8.

As is apparent from the above, a barrier pattern formed within a line pattern region corresponding to a region in which a word line of a memory cell is formed is protected by a protection pattern filled in a portion of the line pattern region, thereby preventing the barrier pattern from being damaged, and thus improving characteristics of the memory cells.

A reaction preventing pattern is formed between the barrier pattern of the line pattern region and the protection pattern to prevent the barrier pattern from reacting with the protection pattern and thus prevent the thickness of the barrier pattern from being reduced in the line pattern region.

In the drawings and specification, exemplary embodiments of the invention have been disclosed, and although specific terms are employed, they are used in a generic and descriptive sense only and not for purpose of limitation. As for the scope of the invention, it is to be set forth in the following claims. Therefore, it will be understood by those of ordinary skill in the art that various changes in form and detail may be made without departing from the spirit and scope of the present invention as defined by the following claims.

What is claimed is:

1. A semiconductor device comprising:
    interlayer dielectrics stacked and spaced apart from each other;
    a channel layer passing through the interlayer dielectrics;
    line pattern regions each surrounding a sidewall of the channel layer to be disposed between the interlayer dielectrics;
    a barrier pattern formed along a surface of each of the line pattern regions and the sidewall of the channel layer;

a reaction preventing pattern formed on the barrier pattern along a surface of a first region of each of the line pattern regions, the first region being adjacent to the channel layer;

a protection pattern filled in the first region on the reaction preventing pattern; and a first metal layer filled in a second region of each of the line pattern regions.

2. The semiconductor device of claim 1, wherein the reaction preventing pattern includes an oxide layer.

3. The semiconductor device of claim 1, wherein the protection pattern has an etch selectivity with respect to the reaction preventing pattern and the barrier pattern.

4. The semiconductor device of claim 1, wherein the protection pattern includes polysilicon.

5. The semiconductor device of claim 1, wherein the first metal layer includes tungsten (W).

6. The semiconductor device of claim 1, further comprising pad pattern regions connected to end portions of the line pattern regions and having a thickness greater than a thickness of the line pattern regions.

7. The semiconductor device of claim 6, wherein the barrier pattern extends along a surface of each of the pad pattern regions.

8. The semiconductor device of claim 7, wherein a thickness of the barrier pattern on the pad pattern regions is less than that of the barrier pattern on the line pattern regions.

9. The semiconductor device of claim 7, further comprising:

an etch stop pattern formed along a surface of the barrier pattern on each of the pad pattern regions; and a second metal layer filled in each of the pad pattern regions on the etch stop pattern.

10. The semiconductor device of claim 9, wherein the etch stop pattern includes $TiNSi_x$, where x is a natural number.

11. The semiconductor device of claim 9, wherein the second metal layer includes tungsten (W).

12. The semiconductor device of claim 9, wherein the second metal layer is filled in a portion of each of the pad pattern regions such that the pad pattern regions are opened by a predetermined width from edges of the pad pattern regions.

* * * * *